United States Patent
Arvin et al.

(10) Patent No.: US 10,287,702 B2
(45) Date of Patent: *May 14, 2019

(54) SEPARATION OF ALPHA EMITTING SPECIES FROM PLATING BATHS

(71) Applicant: International Business Machines Corporation, Armonk, NY (US)

(72) Inventors: Charles L. Arvin, Savannah, GA (US); Michael S. Gordon, Yorktown Heights, NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

This patent is subject to a terminal disclaimer.

(21) Appl. No.: 16/050,760

(22) Filed: Jul. 31, 2018

(65) Prior Publication Data

US 2018/0355504 A1 Dec. 13, 2018

Related U.S. Application Data

(60) Continuation of application No. 15/884,572, filed on Jan. 31, 2018, which is a division of application No. (Continued)

(51) Int. Cl.
*C25D 3/30* (2006.01)
*C25D 5/18* (2006.01)
(Continued)

(52) U.S. Cl.
CPC ............... *C25D 21/12* (2013.01); *C25D 3/30* (2013.01); *C25D 3/54* (2013.01); *C25D 5/02* (2013.01);
(Continued)

(58) Field of Classification Search
None
See application file for complete search history.

(56) References Cited

U.S. PATENT DOCUMENTS

| | | |
|---|---|---|
| 2,910,345 A | 10/1959 | Van Winkle et al. |
| 3,271,320 A | 9/1966 | Moore et al. |

(Continued)

FOREIGN PATENT DOCUMENTS

| | | |
|---|---|---|
| JP | 59064790 A | 4/1984 |
| JP | 01283398 A | 11/1989 |
| JP | 02228487 A | 9/1990 |

OTHER PUBLICATIONS

Chandrasekar, M.S., et al., "Pulse and pulse reverse plating—Conceptual, advantages and applications." Electrochimica Acta 53 (2008) 3313-3322, Jan. 15, 2008.
(Continued)

*Primary Examiner* — Brian W Cohen
(74) *Attorney, Agent, or Firm* — ZIP Group PLLC

(57) ABSTRACT

A plating product fabrication method includes forming a first concentrate. The concentrate includes a metal species, such as Tin, and a trace amount of an alpha emitting species, such as Polonium. The plating product fabrication method also includes creating a circuit between a filtering anode and a filtering cathode and reducing the alpha emitting species from the concentrate by plating the alpha emitting species upon the filtering cathode. In this manner, a purified concentrate is formed. The purified concentrate may be utilized to plate the metal species upon a plating cathode. The purified concentrate may be utilized to form a purified metal species.

8 Claims, 14 Drawing Sheets

Related U.S. Application Data

15/137,068, filed on Apr. 25, 2016, now Pat. No. 10,030,315, which is a continuation of application No. 14/950,720, filed on Nov. 24, 2015, now Pat. No. 9,359,687.

(51) Int. Cl.

| | |
|---|---|
| *C25D 3/02* | (2006.01) |
| *C25D 21/18* | (2006.01) |
| *C25D 21/12* | (2006.01) |
| *C25D 7/12* | (2006.01) |
| *C25D 21/06* | (2006.01) |
| *C25D 21/14* | (2006.01) |
| *C25D 21/10* | (2006.01) |
| *C25D 5/02* | (2006.01) |
| *C25D 3/54* | (2006.01) |
| *H01L 23/00* | (2006.01) |
| *C25D 5/56* | (2006.01) |
| *H01L 21/288* | (2006.01) |
| *H01L 21/66* | (2006.01) |
| *C25D 17/00* | (2006.01) |
| *C25D 17/10* | (2006.01) |

(52) U.S. Cl.
CPC ............... *C25D 5/18* (2013.01); *C25D 5/56* (2013.01); *C25D 7/12* (2013.01); *C25D 17/001* (2013.01); *C25D 21/06* (2013.01); *C25D 21/10* (2013.01); *C25D 21/14* (2013.01); *C25D 21/18* (2013.01); *H01L 21/2885* (2013.01); *H01L 22/14* (2013.01); *H01L 24/11* (2013.01); *C25D 17/10* (2013.01); *H01L 2224/117* (2013.01); *H01L 2224/11462* (2013.01)

(56) References Cited

U.S. PATENT DOCUMENTS

| | | |
|---|---|---|
| 4,615,776 A | 10/1986 | Sasaki et al. |
| 5,431,798 A | 7/1995 | Shimamune et al. |
| 5,651,873 A | 7/1997 | Uchiyama et al. |
| 5,750,017 A | 5/1998 | Zhang |
| 6,638,847 B1 | 10/2003 | Cheung et al. |
| 7,309,411 B2 | 12/2007 | Herdman et al. |
| 8,262,873 B2 | 9/2012 | Wurn et al. |
| 8,277,774 B2 | 10/2012 | Werner et al. |
| 8,992,759 B1 | 3/2015 | Silinger et al. |
| 2009/0098012 A1 | 4/2009 | Shindo et al. |
| 2012/0298586 A1 | 11/2012 | Grandbois et al. |
| 2013/0028786 A1 | 1/2013 | Kanou |
| 2013/0028795 A1 | 1/2013 | Bisaiji |
| 2013/0341196 A1 | 12/2013 | Silinger et al. |
| 2014/0183050 A1 | 7/2014 | Okada et al. |
| 2016/0097139 A1 | 4/2016 | Takemoto |

OTHER PUBLICATIONS

Van Horn, Chuck, "Pulse Plating," http://www.dynatronix.com/wp-content/uploads/2014/02/Article-112.pdf.

List of IBM Patents or Patent Applications Treated As Related, dated herewith.

SEPARATION OF ALPHA EMITTING SPECIES FROM PLATING BATHS

FIELD

Embodiments of invention generally relate to the fabrication of semiconductor devices, such as a wafer, semiconductor chip, chip carrier, etc. More particularly, embodiments relate to removing alpha particle emitting species, such as Polonium (Po), from a plating bath utilized in the fabrication of conductive elements, such as contacts, in semiconductor devices.

BACKGROUND

Formation of integrated circuit structures of a semiconductor device may utilize plating processes. During plating, a metal or other electrically conductive material is plated from an exposed surface. In certain implementations the electrically conductive material takes the form of contacts, solder bumps, etc. that are utilized to interconnect the semiconductor device to external circuitry.

The Restriction of Hazardous Substances Directive (RoHS) restricts the use of certain hazardous substances in electrical and electronic equipment and has driven the electronics industry to move away from solders that contain Lead (Pb). As a result, lead-free solder material, such as Tin (Sn), may now be utilized in the solder bump plating processes.

In order to reduce soft errors within the semiconductor device it may be beneficial to utilize low alpha particle emitting electrically conductive materials in the plated electrically conductive materials. A low alpha particle emitting electrically conductive material is an electrically conductive material having an alpha particle emissivity value of less than $2\alpha/cm^2/1000$ hours. However, the cost of low alpha particle emitting electrically conductive materials may be 2-7 times the cost of the associated raw material which may include a trace amount of alpha particle emitting particles.

SUMMARY

In an embodiment, a plating product fabrication method is presented. The fabrication method includes forming a first concentrate. The concentrate includes a metal species and a trace amount of an alpha emitting species. The fabrication method further includes creating a circuit between a filtering anode and a filtering cathode. The fabrication method further includes reducing the alpha emitting species from the concentrate by plating the alpha emitting species upon the filtering cathode.

These and other embodiments, features, aspects, and advantages will become better understood with reference to the following description, appended claims, and accompanying drawings.

BRIEF DESCRIPTION OF THE DRAWINGS

So that the manner in which the above recited features of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

The drawings are not necessarily to scale. The drawings are merely schematic representations, not intended to portray specific parameters of the invention. The drawings are intended to depict only exemplary embodiments of the invention. In the drawings, like numbering represents like elements.

DETAILED DESCRIPTION

Detailed embodiments of the claimed structures and methods are disclosed herein; however, it can be understood that the disclosed embodiments are merely illustrative of the claimed structures and methods that may be embodied in various forms. These exemplary embodiments are provided so that this disclosure will be thorough and complete and will fully convey the scope of this invention to those skilled in the art. In the description, details of well-known features and techniques may be omitted to avoid unnecessarily obscuring the presented embodiments.

Various embodiments are related to non alpha particle controlled Tin including Tin and a trace amount of Polonium being utilized as a plating anode to selectively plate Tin upon a plating cathode. Tin may be selectively plated by pulse plating the non alpha particle controlled Tin with current control to suppress plating of Polonium upon the plating cathode. Tin may also be selectively plated by pulse plating the non alpha controlled Tin with potential control to suppress plating of Polonium upon the plating cathode. Tin may also be selectively plated by pulse and reverse plating to plate out Polonium upon a filtering cathode. Tin may also be selectively plated by plating out Polonium upon a filtering cathode within a concentrate. Tin may also be selectively plated by plating out purified Tin upon a filtering cathode, separating the purified Tin from the filtering cathode, and utilizing the purified Tin to plate Tin upon the plating cathode. The isotope $^{210}$Po emits alpha particles at energies of 5.3 Million Electron Volt (MeV).

Referring now to the FIGs, wherein like components are labeled with like numerals, exemplary embodiments that involve a semiconductor carrier, semiconductor device, such as a wafer, chip, integrated circuit, microdevice, etc in accordance with embodiments of the present invention are shown, and will now be described in greater detail below. It should be noted that while this description may refer to components in the singular tense, more than one component may be depicted throughout the FIGs. The specific number of components depicted in the FIGs. and the orientation of the structural FIGs. was chosen to best illustrate the various embodiments described herein.

Figure 1:
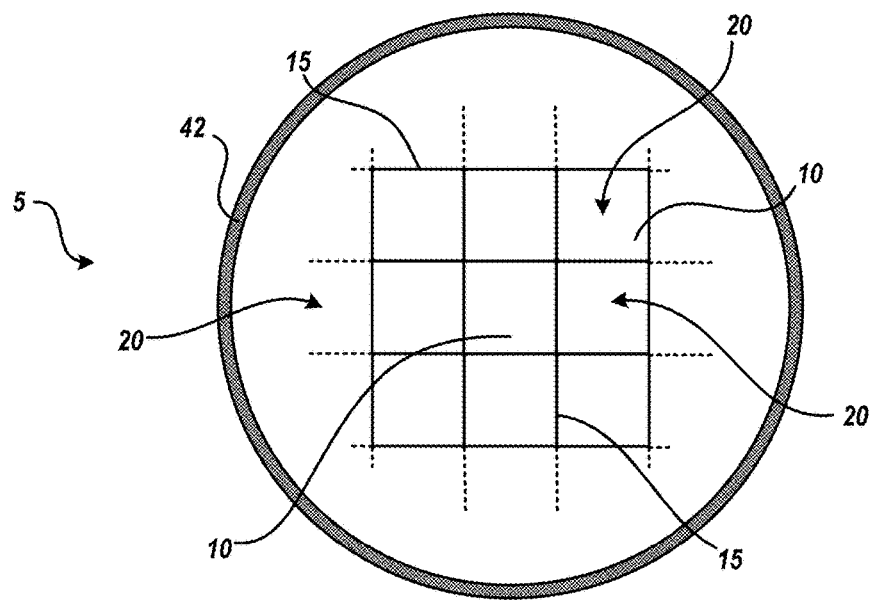
FIG. 1 depicts a semiconductor wafer that may include various embodiments of the present invention.

FIG. 1 depicts a semiconductor wafer 5, in accordance with various embodiments of the present invention. Wafer 5 may include a plurality of semiconductor chips 10 separated by kerfs 15. Each chip 10 may include an active region 20 wherein integrated circuits including microdevices may be built using microfabrication process steps such as doping or ion implantation, etching, deposition of various materials, photolithographic patterning, wire formatting, plating, etc. Wafer 5 also includes an exposed area that which a plating tool electrically contacts wafer 5 to enable plating electrically conductive materials. The wafer 5 may be diced to form individual semiconductor chips 10.

Figure 2:
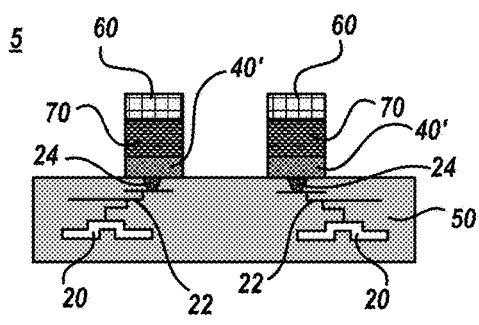
FIG. 2 depicts a cross section view of a semiconductor device that may include various embodiments of the present invention.

FIG. 2 depicts a cross section view of a portion of a semiconductor device such as semiconductor wafer 5 or semiconductor chip 10, in accordance with various embodiments of the present invention. The semiconductor device includes a semiconductor substrate 50 and a microdevice 20, wiring 22, wiring contact 24 therein. The semiconductor device also includes a contact structure including a residual plating portion 40', plate 70, and purified solder bump 60.

The semiconductor substrate 50 may include, but is not limited to: any semiconducting material such conventional Si-containing materials, Germanium-containing materials, GaAs, InAs and other like semiconductors. Si-containing materials include, but are not limited to: Si, bulk Si, single crystal Si, polycrystalline Si, SiGe, amorphous Si, silicon-on-insulator substrates (SOI), SiGe-on-insulator (SGOI), annealed poly Si, and poly Si line structures. In various embodiments, substrate 50 may be, for example, a layered substrate (e.g. SOI substrate), a bulk substrate, a planar device substrate, etc. The substrate 50 includes a microdevice 20 such as a back end of the line microdevice, front end of the line microdevice, middle of the line microdevice and wiring 22 including one or more wiring layers electrically connected to the microdevice 20. In a particular embodiment, microdevice 20 is a field effect transistor (FET), such as a fin FET, pFET, nFET, etc. The wiring 22 is electrically connected to the contact structure by wiring contact 24. The wiring contact 24 and wiring 22 allows for current to be transferred from an external surface of substrate 50 to microdevice 20.

Figure 4:
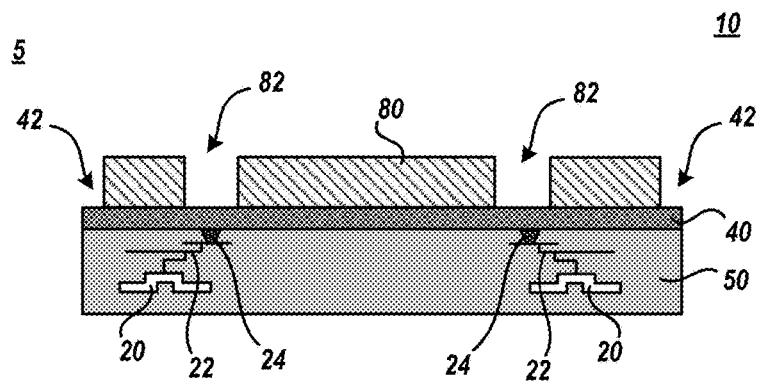
FIG. 4 depicts a cross section view of a semiconductor device at a particular stage of fabrication, according to embodiments of the present invention.

Residual plating portion 40' is formed by retaining a portion of shorting layer 40, shown in FIG. 4, an electrically conductive layer that is formed upon the substrate 50 and utilized to plate electrically conductive materials. Plate 70 is formed by plating electrically conductive material upon the shorting layer 40 and purified solder bump 60 is formed by plating solder material upon the plate 70. Purified solder bump 60 is treated by various techniques as described herein to reduce alpha particle emitting elements from the solder material.

Figure 3:
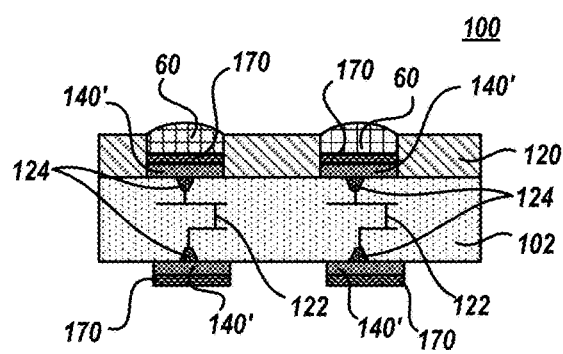
FIG. 3 depicts a cross section view of a semiconductor carrier that may include various embodiments of the present invention.

FIG. 3 depicts a cross section view of a portion of a semiconductor carrier 100, in accordance with various embodiments of the present invention. The semiconductor carrier includes a laminate 102, wiring 122, wiring contact 124. The semiconductor carrier 100 also includes a contact structure including a residual plating portion 140', plate 170, and purified solder bump 60. Laminate 102 may be an organic carrier or a ceramic carrier. The contact structures, wiring 124, etc. provide electrical paths from the upper surface of carrier 100 to the opposing side of carrier 100. Residual plating portion 140' is formed by retaining a portion of a shorting layer (not shown), formed upon the laminate 102 and utilized to plate electrically conductive materials. Plate 170 is formed by forming a patterned photoresist upon the shorting layer 40 and plating an electrically conductive material upon the shorting layer within the photo resist pattern. The photoresist is subsequently removed and excess shorting layer material is etched away. Purified solder bump 60 allows for the electrical connection of a semiconductor chip 10 to a particular side of laminate 102 and/or allows for the electrical connection of the laminate 102 to an external electrical device. The purified solder bump 60 may be placed, screened, etc. upon plate 170. Solder mask 120 may be formed upon the laminate 102 to aid in the placement and retention of the purified solder bump 60 upon plate 170. The purified solder bump 60 is treated by various techniques as described herein to reduce alpha emitting elements from the solder material.

FIG. 4 depicts a cross section view of a semiconductor device, such as wafer 5, semiconductor chip 10, etc. at a particular stage of fabrication. At the present stage of fabrication, shorting layer 40 is formed upon substrate 50 and a patterned mask 80 is formed upon the shorting layer 40.

Shorting layer 40 may be formed using a sputtering technique or other known deposition technique. In embodiments, the shorting layer 40 may be, for example, copper or other conductive metal such as, for example, nickel, nickel alloys, copper alloys, etc. The shorting layer 40 may be multilayered and further include a barrier layer which may be, for example, Titanium, Titanium Tungsten, or Titanium Tungsten Chrome. The shorting layer 40 may be about 0.45 microns thick; although other dimensions are also contemplated by the present invention such as, for example, a range of about between 0.1 to 0.6 microns. In certain embodiments, shorting layer 40 is utilized as a shorting layer where a plating tool electrically contacts wafer 5 to enable plating of plate 70, solder bumps, etc.

Mask 80 may be a known mask material such as a photoresist that may be patterned formed upon the shorting layer 40. Mask 80 may be applied as a liquid upon shorting layer 40 that may dry and be patterned generally forming trenches 82 within the mask 80 that expose portions of the shorting layer 40. For example, when mask 80 is a photoresist, a liquid photoresist may be formed by precision spraying, roller coating, dip coating, spin coating, etc. Exemplary liquid photoresists can be either positive tone resists such as TCIR-ZR8800 PB manufactured by Tokyo Ohka Kogyo America, Inc. or negative tone resists such as JSR THB 126N manufactured by JSR Micro, Inc., Poly (methyl methacrylate) (PMMA), Poly(methyl glutarimide) (PMGI), Phenol formaldehyde resin (DNQ/Novolac), etc. Mask 80 may also be a semi-solid film coated, laminated, or otherwise formed upon shorting layer 40. For example, mask 80 may be a dry photoresist such as Asahi CX8040, Asahi CXA240, Riston photoresists, WBR photoresists.

Mask 80 is of sufficient thickness to form desired contact structures. As such, mask 80 may be chosen to be of a material and a thickness to satisfy such requirements. For example, mask 80 may have a thickness ranging from about 10 um to about 500 um, although a thickness less than 40 um and greater than 500 um have been contemplated. In one embodiment, mask 80 may be about 150 um to 175 um thick. Perimeter portions of shorting layer 40 are left uncovered by mask 80 forming electrically conductive perimeter region 42.

A pattern may be formed in the mask 80 by removing portions of the mask 80. For example, when mask 80 is a photoresist, portions of the mask 80 may be exposed to radiation such as deep ultraviolet light or electron beams. Once the patterning of mask 80 is completed, portions of the mask 80 may be retained and portions of mask 80 may be etched away by an etchant that removes mask 80 material. The portions of mask 80 that are etched away reveal the underlying shorting layer 40. In various embodiments, the portions of mask 80 that are etched away form trenches 82 in which electrically conductive materials may be plated within.

Figure 5:
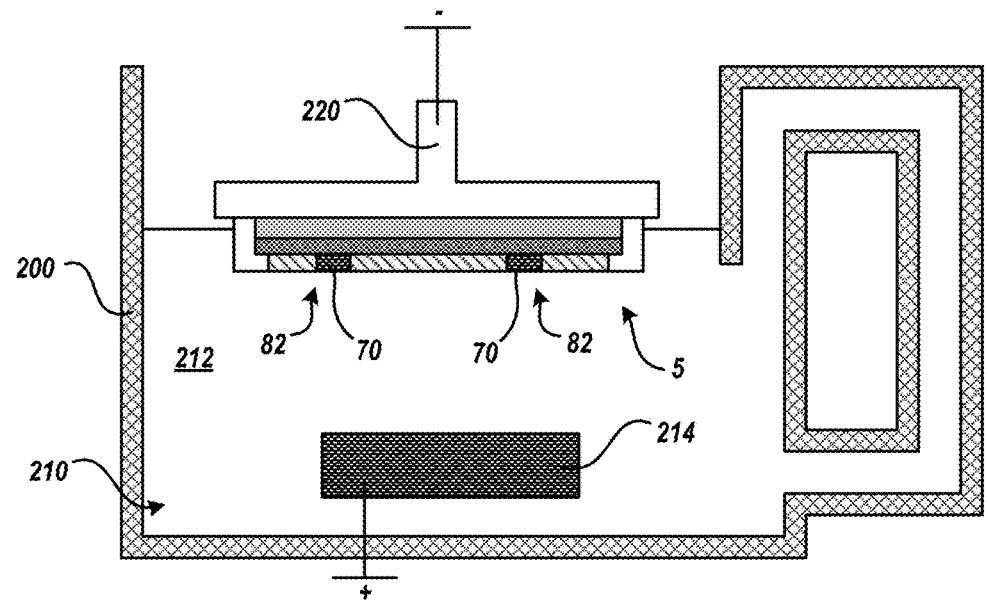
FIG. 5 and FIG. 6 depict respective plating tools and semiconductor devices at a particular stage of fabrication, in accordance with various embodiments of the present invention.

Referring now to FIG. 5, which depicts a plating tool 200 and wafer 5 at a stage of fabrication in which plate 70 is formed upon shorting layer 40. Plating, electroplating, electrodeposition, etc. is a process in which wafer 5 is placed in a reservoir 210 which contains a plate 70 plating solution 212 (e.g. plating bath, etc.). The wafer 5 may be attached to a fixture 220 that accepts wafer 5, wraps around wafer 5, and contacts electrically conductive perimeter region 42 such that only the shorting layer 40 within trenches 82 are exposed to the plating solution 212. An electrical circuit is created when a negative terminal of a power supply contacts electrically conductive perimeter region 42 of wafer 5 so as to form a cathode and a positive terminal of the power supply is connected to plating material 214 in the tool 200 so as to form an anode.

Typically, plating tools or the power supplies themselves have the capability of controlling pulse plating parameters. For example, in a pulse plate operation, the plating tool may control the amount of time the current is off and the amount of time the current is on which may be set upon the plating tool via a user interface. The pulse plating operation may be controlled to a constant current or a constant potential pulse. In the constant current mode, the tops of the current wave form are kept flat by allowing the potential to vary during the pulse on-time. In the constant potential mode, the tops of the potential pulses are kept flat by varying the current during the pulse on-time. Generally, pulse plating is utilized to produce fine grain flat plated material. However, in embodiments described herein, pulse plating is utilized to selective plate a particular specie while suppressing the plating of another specie.

The plating material 214 may be a stabilized metal specie in the plating solution 212. During the plating process, when an electrical current is passed through the circuit, this metal specie is dissolved in the solution 212 which take-up electrons forming plate 70 upon the exposed shorting layer 40 within trenches 82. In a particular embodiment, the plating material 214 may be, for example, copper (Cu). In an exemplary Cu plating process, in a sulfate solution, copper is oxidized at the anode to $Cu^{2+}$ by losing two electrons. The $Cu^{2+}$ associates with $SO_4^{2-}$ in the solution to form copper sulfate. At the cathode, the $Cu^{2+}$ is reduced to metallic Cu by gaining two electrons.

Figure 6:
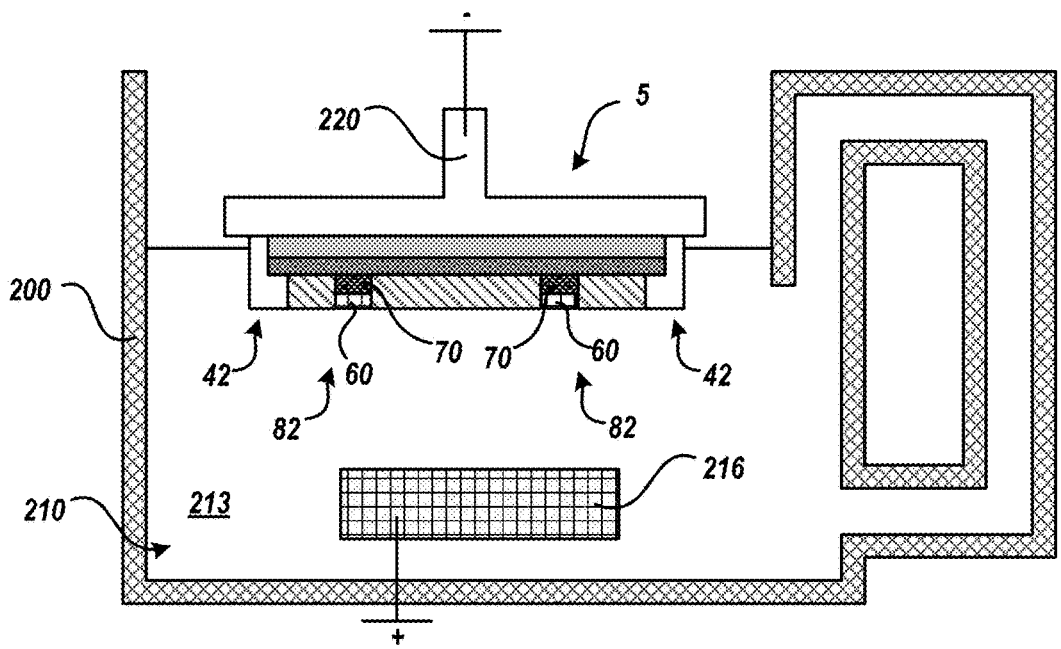

Referring now to FIG. 6, which depicts a plating tool 200 and wafer 5 at a stage of fabrication in which purified solder 60 is formed upon plate 70. Subsequent to the formation of plate 70, wafer 5 is placed in a reservoir 210 which contains a solder 60 plating solution 213. The wafer 5 may again be attached to fixture 220 that accepts wafer 5, wraps around wafer 5, and contacts electrically conductive perimeter region 42 such that only the plate 70 within trenches 82 are exposed to the plating solution 213. An electrical circuit is created when a negative terminal of a power supply contacts electrically conductive perimeter region 42 of wafer 5 so as to form a cathode and a positive terminal of the power supply is connected to a solder 60 purified plating material 216 in the tool 200 so as to form an anode. Purified plating material 216 is a material upon which an alpha particle emitting reduction technique have been performed or a material where it has been determined that the alpha particle emissivity is below a predetermined acceptable threshold.

The purified plating material 216 may be a stabilized metal specie in the plating solution 213. During the plating process, when an electrical current is passed through the circuit, this metal specie is dissolved in the solution 213 which take-up electrons forming purified solder 60 upon the exposed plate 70 within trenches 82. In a particular embodiment, the purified plating material 216 may be, for example, Tin (Sn). In an exemplary Sn plating process, in a methanesulfonate solution, Sn is oxidized at the anode to $Sn^{2}+$ by losing two electrons. The $Sn^{2}+$ associates with two $CH_3SO_3$ in the solution to form tin methylsulfonate. At the cathode, the $Sn^{2}+$ is reduced to metallic Sn by gaining two electrons.

Figure 7:
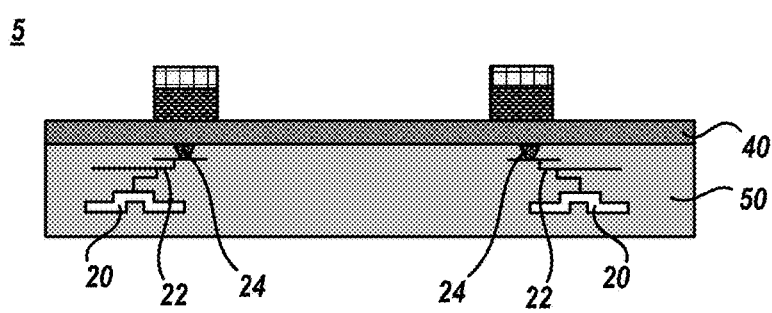
FIG. 7 and FIG. 8 depict cross sections of a semiconductor device at particular stages of fabrication, according to embodiments of the present invention.
Figure 8:
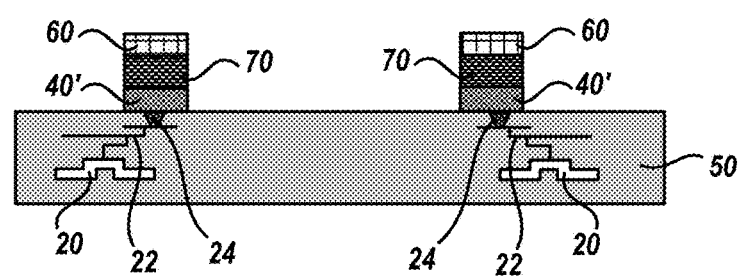

FIG. 7 depicts a cross section of a semiconductor device at particular stages of fabrication where mask 80 is removed. For example, mask 80 may be removed chemically or by utilizing an oxygen based ME, laser based ablative photodecomposition (APD), etc. FIG. 8 depicts a cross section of a semiconductor device at particular stages of fabrication where portions of shorting layer 40 are removed and other portions 40' of the shorting layer are retained. Portions of shorting layer 40 may be removed by, for example, utilizing a wet etch, dry etch, or combination. In other embodiments, portions of shorting layer may be removed by other known processes such as, for example, liquid or gas flux techniques. In certain embodiments only the portions of shorting layer 40 exterior the contact structure (e.g. plate 70, etc.) are removed leaving retained portions 40' of the shorting layer under plate 70.

Upon the removal of portions of shorting layer 40, a contact structure is formed and may include the retained portion 40' of shorting layer, plate 70, and solder bump 60, etc. The width/diameter of the contact structure is generally similar to the width of the trench 82 of the mask 80. In certain embodiments, an argon, oxygen, etc. RIE ash may be performed to refresh the retained surfaces of the semiconductor device subsequent to the removal of mask 80 and/or removal of the portions shorting layer 40.

It has been determined that Po is an element contributing to alpha particle emissions, specifically the isotope $^{210}Po$. Therefore, to reduce particle alpha emissions, Po may be separated from Sn utilizing an alpha particle emitting reduction technique further described herein. By separating Po from Sn it may be possible to utilize an inexpensive non low alpha particle emitting Sn and an alpha particle emitting reduction technique to form purified solder bumps 60.

Various alpha emitting reduction techniques are herein contemplated:

Pulse plating of a Sn and trace Po alloy anode with current control to suppress plating of Po;

Pulse plating of a Sn and trace Po alloy anode with potential control to suppress plating of Po;

Pulse and Reverse plating of a Sn and trace Po alloy anode with a filtering anode and filtering cathode to plate out Po upon the filtering cathode;

Plating of a Sn and trace Po concentrate with a filtering anode and filtering cathode to plate out Po upon the filtering cathode;

Plating of a Sn and trace Po concentrate with a filtering anode and filtering cathode to plate out Sn upon the filtering cathode and subsequently utilizing the Sn as a plating anode;

Heating of a Sn and trace Po alloy to form and subsequently remove a stannic oxide and accumulated Po concentrated within the stannic oxide;

Heating of semiconductor device comprising a Sn and trace Po solder bump(s) to form and subsequently remove a stannic oxide and accumulated Po concentrated within the stannic oxide;

Heating of semiconductor carrier comprising a Sn and trace Po solder bump(s) to form and subsequently remove a stannic oxide and accumulated Po concentrated within the stannic oxide, and;

Filtering Po from a plating bath utilizing a Po filter element.

FIG. 9-FIG. 17C generally depict embodiments related to plating operations performed upon a Sn and trace Po alloy to generally reduce the concentration of Po.

Figure 9:
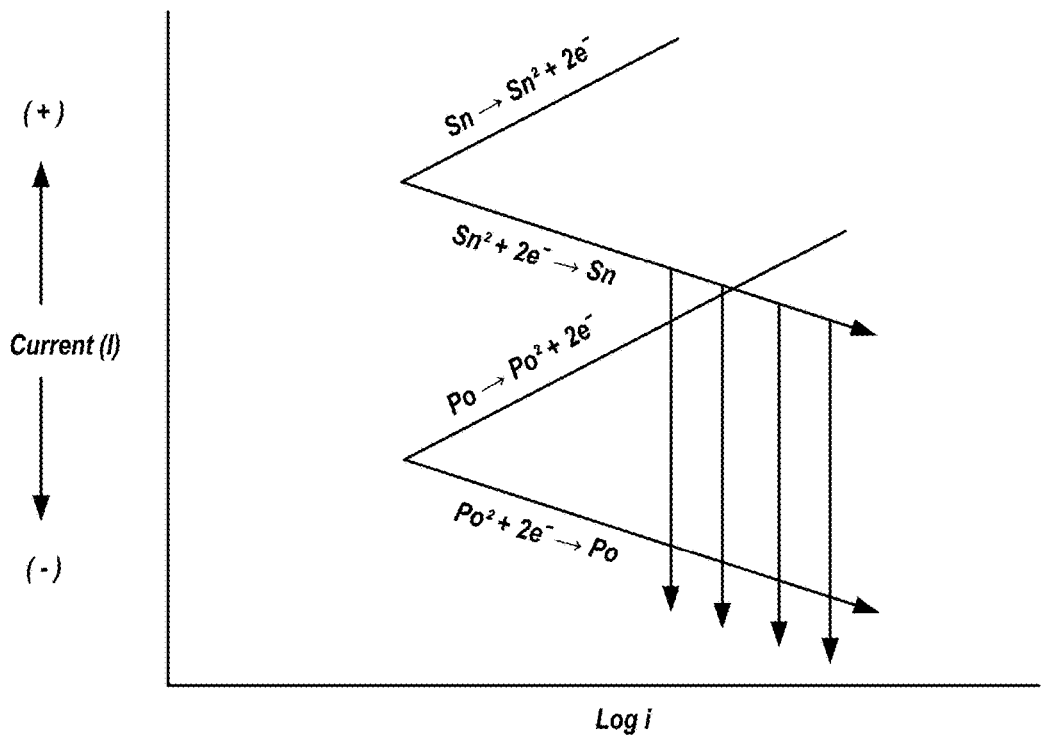
FIG. 9 depicts electrochemistry Sn and Po plating curves.

FIG. 9 depicts electrochemistry Sn and Po plating curves. The x-axis plots a plating current value and the y-axis plots a plating voltage value. Reference to these Sn and Po plating curves may be relevant when plating a Sn and trace Po alloy. When the Sn and trace Po alloy is plated, Sn is plated prior to the plating of Po. As depicted in the Sn and Po plating curves, Sn plates (i.e. $Sn^{2}+$ reduces to Sn) at a higher potential relative to the plating (i.e., reduction of $Po^{2}+$ to Po) and therefore plates prior to Po. Thus, it is possible to selectively plate Sn by controlling the potential of the plating tool to stay above the plating potential of Po.

It is also possible to selectively plate Sn by pulse plating, ensuring fast mass transport to suppress, reduce, or eliminate the plating of Po. Pulse plating involves the swift alternating of the potential or current between two different values resulting in a series of pulses of equal amplitude, duration and polarity, separated by zero current. Each pulse consists of an on-time during which potential and/or current is applied and an off-time during which zero current is applied as. By changing the pulse amplitude and width, it is possible to change the plated material composition and thickness.

In plating, the cathode is polarized negatively. This results in a charged layer of mostly positively charged ions (cations) near the surface of the cathode. Prior to the transfer of electrons from the cathode to the cations that results in the deposition of the metal, the cations (1) adsorb onto the surface sites on the cathode and (2) the potential at the cathode should be sufficiently negative so that an electron transfer process can occur. Not all surface sites will transfer electrons at the same time. There are certain sites (i.e. kinks, ledges) that will enable a transfer of an electron at a lower energy barrier than others (i.e. plateau). In addition, Sn atoms will accept an electron at a lower potential than Po atoms. The total number of electrons available impacts how many total ions can deposit at any one period. Each cation that is converted to metal is replenished by ions from the bulk solution. In order for replenishment occur, ions must move from the bulk solution to the surface. The mode of this transport can either be through diffusion or convection. Diffusion occurs within the area of solution immediately above the surface of the cathode. The thickness of this diffusion layer is dependent upon the agitation that occurs above the surface of the wafer. For example, the thickness can range from ca. 7 to 100 um. Diffusion is slower than convection. Thus, the thinner the diffusion layer, the faster the ions can reach the surface of the wafer.

When plating two components, there are surface potential and statistics concerns. If the potential is below the potential at which Po would plate, then only Sn would deposit. However, if the potential is such that both Sn and Po could plate, Sn will plate first but some Po will plate on surface sites that enable easier electron transfer to occur (i.e. a kink or ledge location). If it takes too long for the ions to move from the bulk solution to the surface, then the ratio of Po to Sn ions on the surface will increase as the Sn ions are consumed. Therefore, over time more Po ions will deposit.

When direct current plating is used, a steady state situation occurs. However, the steady state is such that there is a higher ratio of Po to Sn ions on the surface than the instance before the current was turned on. With pulse plating, the anode or cathode terminal is periodically turned off to allow time for the ions to move across the hydrodynamic barrier to populate the surface sites. In this manner, the ratio of Po to Sn ions is kept to a minimum which limits the amount of Po that is incorporated into the deposit. The duration of the off time pulse is dependent upon the thickness of the hydrodynamic layer. Thus, if agitation is poor, the off time pulse must be longer to enable the additional time for the surface sites to be repopulated before plating commences again. The on-time is somewhat fixed in that any time longer than a pulse of 20 msec will consume the ions on the surface sites and will behave exactly as direct current plating. The ideal on time appears to be between 100 microseconds and 500 microseconds. The off time is dependent upon the agitation. With maximum agitation (i.e. ca. 10 um hydrodynamic layer) the ideal off time is between 100 and 500 microseconds with the off time being at least as long as the on time. Thus, pulse plating effectively increases the concentration of $Sn^{2+}$ ions at the cathode relative to the concentration of $Po^{2+}$ ions at the cathode. Therefore, by pulse plating, the plating of Sn is generally increased while the plating of Po is generally suppressed.

Figure 10:
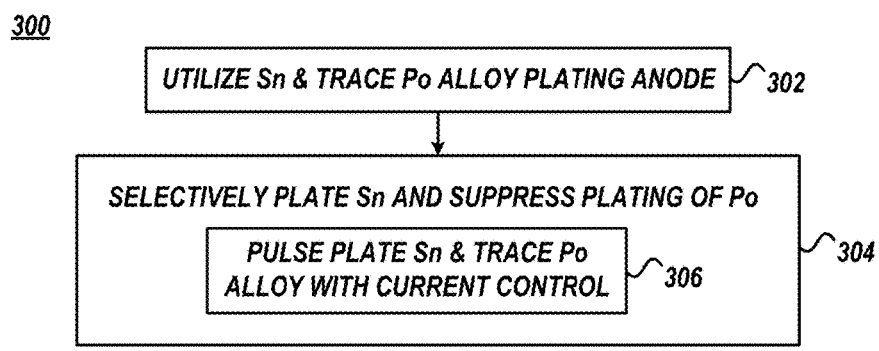
FIG. 10 depicts a semiconductor device fabrication method to form electrically conductive material thereupon by selectively plating Sn while suppressing plating of Po, according to embodiments of the present invention.

FIG. 10 depicts a semiconductor device fabrication method 300 to form electrically conductive material thereupon by selectively plating Sn while suppressing plating of Po, according to embodiments of the present invention. Method 300 may be utilized in the fabrication of a wafer 5, chip 10, etc. More specifically, method 300 may be utilized in the solder bump formation fabrication stage of the wafer 5, chip 10, etc.

Method 300 begins with associating a wafer 5 with a plating tool 200. For example, wafer 5 may be installed upon fixture 220 such that fixture 220 contacts electrically conductive perimeter region 42. The wafer 5 and fixture 220 assembly is inserted into the plating tool 200 and is connected to a power supply to become a plating cathode. To plate solder bumps upon the semiconductor device, a Sn and trace Po alloy within a plating bath is electrically connected to the power supply to become a plating anode (block 302).

Method 300 may continue by selectively plating Sn while suppressing plating of Po (block 304). For example, the plating tool may plate a greater concentration of Sn than the original concentration of Sn in the Sn and trace Po alloy. In other words, purified Sn having reduced alpha particle emissions may be plated. In a particular embodiment, the Sn and trace Po alloy anode may be pulse plated with current control to increase the concentration of Sn plated (block 306). The term "current control" indicates that the pulse plating occurs within the plating tool 200 at a particular current maintained or otherwise controlled. For example, the plating tool 200 may control the pulse plating current pulse amplitude, width, etc. In a particular example, the pulse plating technique may utilize a 0.5 duty factor (DF). The DF indicates the proportion of plating time (e.g. 0.005 msec, etc.) to the total time. As such, a 0.5 DF indicates that the time of each current pulse is equivalent to the time of zero current between pulses.

Figure 11:
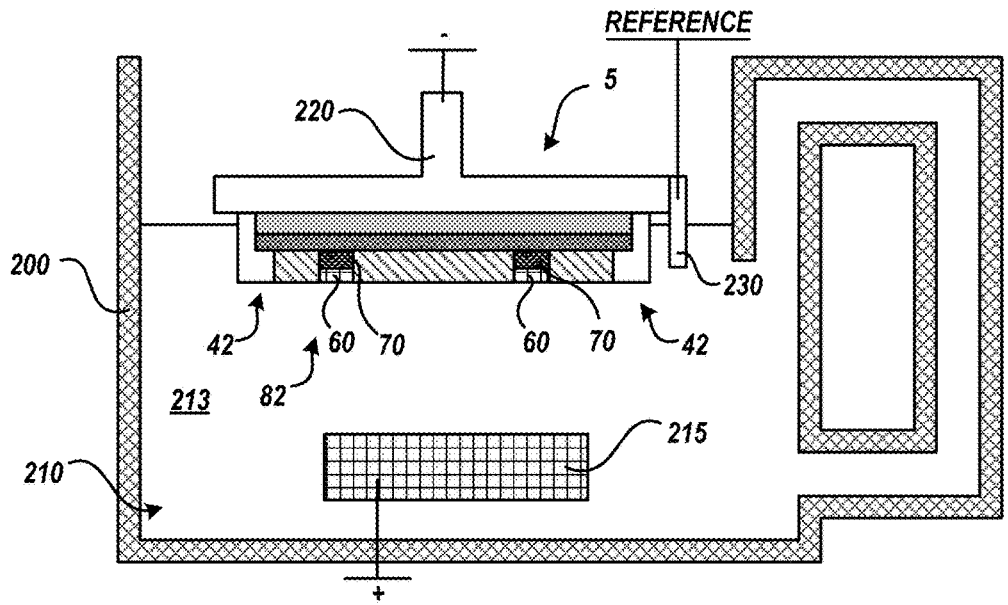
FIG. 11 depicts a plating tool and semiconductor device at a particular stage of fabrication, in accordance with various embodiments of the present invention.

FIG. 11 depicts a plating tool 200 and semiconductor device at a particular stage of fabrication to form electrically conductive material thereupon by selectively plating Sn while suppressing plating of Po, according to embodiments of the present invention. In the present embodiment, plating tool 200 includes wafer 5, fixture 220, reference electrode 230, and a Sn and trace Po alloy 215. Wafer 5 is installed to fixture 220 such that fixture 220 contacts electrically conductive perimeter region 42. The wafer 5 and fixture 220 assembly is inserted into the plating tool 200 and is connected to a power supply (not shown) to become a plating cathode. To plate solder bumps upon the semiconductor device, a Sn and trace Po alloy 215 is located within plating bath 213 and is electrically connected to the power supply (not shown) to become the plating anode. Electrode 230 measures potential at the plating surface of the plating bath 213. For example, the electrode 230 is placed within the plating bath 213 to be coplanar with the exposed surface of plate 70 to measure the potential at exposed surface of plate 70. Electrode 230 allows for the plating with potential control to increase the concentration of Sn plated. For example, electrode 230 allows for plating tool to maintain or control a plating potential value above the plating potential of Po to suppress the plating of Po.

Figure 12:
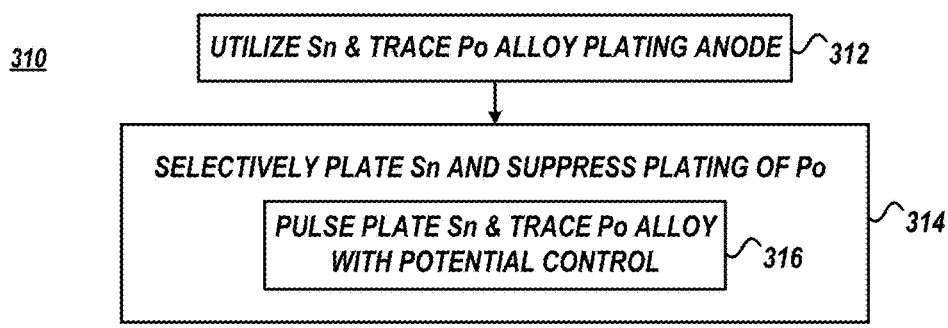
FIG. 12 depicts a semiconductor device fabrication method to form electrically conductive material thereupon by selectively plating Sn while suppressing plating of Po, according to embodiments of the present invention.

FIG. 12 depicts a semiconductor device fabrication method 310 to form electrically conductive material thereupon by selectively plating Sn while suppressing plating of Po, according to embodiments of the present invention. Method 310 may be utilized in the fabrication of a wafer 5, chip 10, etc. More specifically, method 310 may be utilized in the solder bump formation fabrication stage of the wafer 5, chip 10, etc.

Method 310 begins with associating a wafer 5 with a plating tool 200. For example, wafer 5 may be installed upon fixture 220 such that fixture 220 contacts electrically conductive perimeter region 42. The wafer 5 and fixture 220 assembly is inserted into the plating tool 200 and is connected to a power supply to become a plating cathode. To plate solder bumps upon the semiconductor device, a Sn and trace Po alloy 215 within plating bath 213 is electrically connected to the power supply to become a plating anode (block 312).

Method 310 may continue by selectively plating Sn while suppressing the plating of Po (block 314). For example, the plating tool may plate a greater concentration of Sn than the original concentration of Sn in the Sn and trace Po alloy 215. In other words, purified Sn having reduced alpha particle emissions may be plated upon plate 70 forming purified solder 60 from Sn and trace Po alloy 215. In a particular embodiment, the Sn and trace Po alloy 215 anode may be plated with potential control to increase the concentration of Sn plated (block 316) to form purified solder 60. The term "potential control" indicates that the potential of the plating solution at the surface to be plated is controlled or maintained. For example, the plating tool 200 may control the plating potential utilizing electrode 230 in a feedback loop to maintain the plating potential above that which Po reduces to effectively suppress the plating of Po in the plating of purified solder 60.

Figure 13:
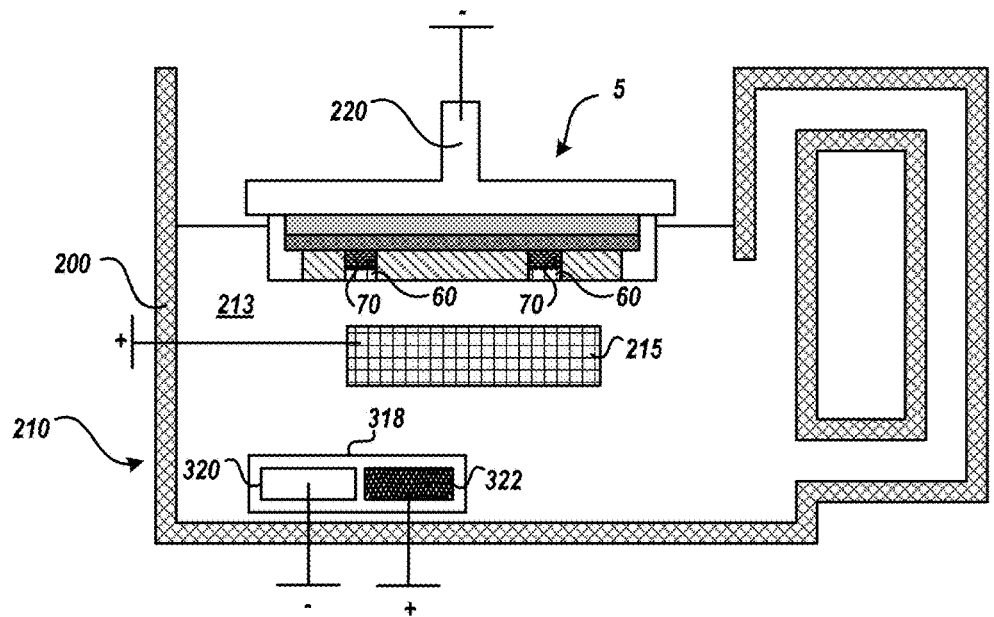
FIG. 13 and FIG. 14 depict respective plating tools and semiconductor devices at a particular stage of fabrication, in accordance with various embodiments of the present invention.
Figure 14:
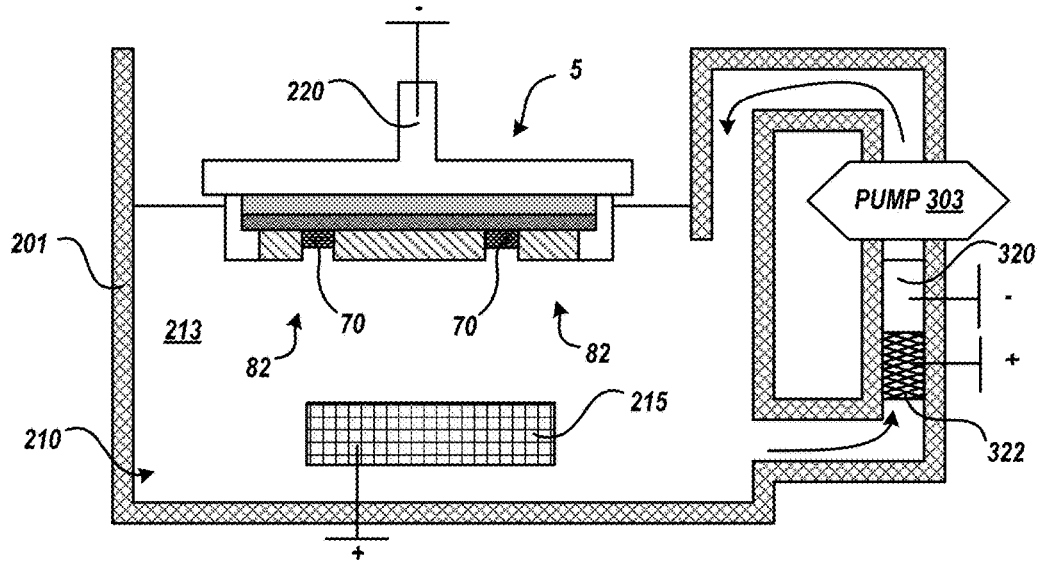

FIG. 13 and FIG. 14 depict plating tools 200 and 201, respectively, and a semiconductor device at a particular stage of fabrication to form electrically conductive material thereupon by selectively plating Sn while suppressing plating of Po, according to embodiments of the present invention. The exemplary plating tools 200 and 201 generally perform a pulse and reverse plate technique to selectively plate Sn upon wafer 5 while suppressing the plating of Po by utilizing a filtering cathode 320 and filtering anode 322 to plate Po upon the filtering cathode 320. Filtering cathode 320 and filtering anode 322 are formed from a material that does not dissolve in plating solution 213 and may be for example, Titanium, Niobium, etc. In a particular embodiment, the filtering anode 322 has a surface area much greater relative to filtering cathode 320. For example, the filtering anode 322 has a ten times larger surface area compared to filtering anode 320. Filtering anode 322 has a surface area much greater relative to filtering cathode 320 so that the anode and cathode will be reversed during the pulse reverse stages so as to control the current density properly in order to concentrate Po on one electrode surface and then to reduce the amount of SnPo alloy dissolved on the other. In a particular embodiment, the filtering anode 322 may be a Titanium mesh and the filtering cathode 320 may be solid Titanium. Filtering cathode 320 and filtering anode 322 are electrically connected to a second or otherwise distinct power supply than that which is connected to wafer 5 and Sn and trace Po alloy 215 anode.

In exemplary plating tool 200, depicted in FIG. 13, the filtering cathode 320 and filtering anode 322 are placed in reservoir 210. The filtering cathode 320 and filtering anode 322 are placed within reservoir 210 to be located near each other relative to their location away from Sn and trace Po alloy 215. To aid in limiting electrical interference between the first anode-cathode (i.e., Sn and trace Po alloy 215 and wafer 5) and the second anode-cathode (i.e. filtering cathode 320 and filtering anode 322), the second anode-cathode are placed a relatively large distance away from the first anode-cathode with neither the second anode nor second cathode placed between the first anode-cathode. For example, filtering cathode 320 and filtering anode 322 are placed near the bottom of reservoir 210 while Sn and trace Po alloy 215 anode is placed near wafer 5. In a particular embodiment, the filtering cathode 320 and filtering anode 322 are placed within an electrical isolation structure 318, such as a polymer enclosure that isolates direct solution line of site to the first anode-cathode to limit electrical interference between the first anode-cathode and the second anode-cathode.

In yet another embodiment, such as that depicted in FIG. 14, the filtering cathode 320 and filtering anode 322 are placed in a plating tool 201 filter housing in which a pump 303 circulates the plating solution 213 within reservoir 210 across the filtering cathode 320 and filtering anode 322. In yet another embodiment, the filtering cathode 320 and/or filtering anode 322 are placed in an accessible location to allow for the replacement of the filtering cathode 320 and/or filtering anode 322.

Generally, the filtering cathode 320 and filtering anode 322 remove Po by plating out Po upon the filtering cathode 320 from $Po^{2+}$ ions that accumulate in the plating bath 213 from the plating of the Sn and trace Po alloy 215 upon wafer 5. More specifically, the first anode-cathode may utilize known plating processes to DC plate Sn and trace Po alloy 215 upon exposed plate 70 within trenches 82 at a first predetermined deposition rate. In association with such plating processes, $Sn^{2+}$ and $Po^{2+}$ ions accumulate within plating solution 213. Simultaneously, the second anode-cathode may utilize pulse and reverse plating techniques to accumulate Po upon the filtering cathode 320 thereby reducing the $Po^{2+}$ ions within the plating solution 213 and thus limiting the $Po^{2+}$ ions near wafer 5.

During normal plating processes on the wafer 5, a vast majority (i.e. 97%) of the current electrons are used to deposit Sn. The remaining current electrons are used to consume hydronium ions ($H^+$) to produce hydrogen gas $H_2$. This results in an increase in $Sn^{2+}$ ions into the plating solution 213. Simultaneously, Sn and trace Po alloy 215 anode will dissolve a trace amount "x" mg Po for every gram of Sn dissolved. Note, the specific amount "x" is not critical. The trace amount "x" of Po that is dissolved (i.e. milligrams) is much less than the amount of Sn that is dissolved (i.e. grams). If the plating is controlled, about $1/10^{th}$ of "x" mg of Po is plated for every gram of Sn deposited. This results in about $9/10^{th}$ "x" mg increase in plating solution 213 for every gram of Sn plated. Over time the amount of Po deposited on the wafer 5 or another wafer 5 inserted into the plating tool would increase. The filtering cathode 320 and filtering anode 322 deposits about 20 times the Po for every gram of Sn deposited. This is accomplished (1) having a higher current density on the filtering cathode 320 than on the wafer 5, (2) having poorer agitation on the filtering cathode 320 that the wafer 5 cathode, (3) having longer pulses on the filtering cathode 320 to mimic DC plating and (4) locally plating purer Sn on the filtering anode 322 during the pulse reverse stages to further increase the Po in the SnPo deposit on the filtering cathode 320. The net reaction on the filtering cathode 320 and filtering anode 322 system will be to generate hydronium ions at the filtering anode 322 and deposit SnPo alloy at the filtering cathode 320. The total mass will be about 3% of that deposited on the wafer 5 cathode. This results in consuming the extra $Sn^{2+}$ accumulated in the plating solution 213 and adding back the hydronium ions consumed on the wafer 5 cathode. In this way, the total dissolved Po+ in plating solution 213 is maintained constant if using a Sn and trace Po alloy 215. If using a purified Sn 214 anode, then the overall $Po^{2+}$ in solution would decrease. Thus, the filtering cathode 320 and filtering anode 322 will maintain or improve the plating solution 213 resulting in a lower alpha particle count on the wafer 5 associated with the formation of purified solder bumps 60.

In pulse and reverse plating, a cathodic pulse is followed by an anodic pulse. The terms cathodic and anodic are utilized to described the current direction in that cathodic indicates that current flow is in normal plating direction (from cathode to anode) and anodic indicates that current flow is in reverse or deplating direction (from anode to cathode). Thus, cathodic and anodic pulses are applied to filtering cathode 320 and filtering anode 322, respectively, to produce a deposit on the filtering cathode that is about 20 times greater in concentration than what is deposited on the wafer cathode. This results in maintaining or reducing the Po' concentration in solution.

In a particular embodiment, the Po is plated upon the filtering cathode 320 at a second higher deposition rate relative to the predetermined first deposition rate of Sn upon wafer 5. For example, with cathodic pulses, the Po is plated upon the filtering cathode 320 at approximately twice the deposition rate of Sn plating upon wafer 5 and, with anodic pulses, is deplated from the filtering cathode 320 at approximately $1/8^{th}$ the rate of Sn plating upon wafer 5. Thus, over time, Po accumulates upon the filtering cathode 320 thereby reducing the $Po^{2+}$ ions within the plating solution 213. In another embodiment, the anodic pulses and cathodic pulses may last at least 20 msec. and may be separated by a non plating time of at least 20 msec.

Figure 15:
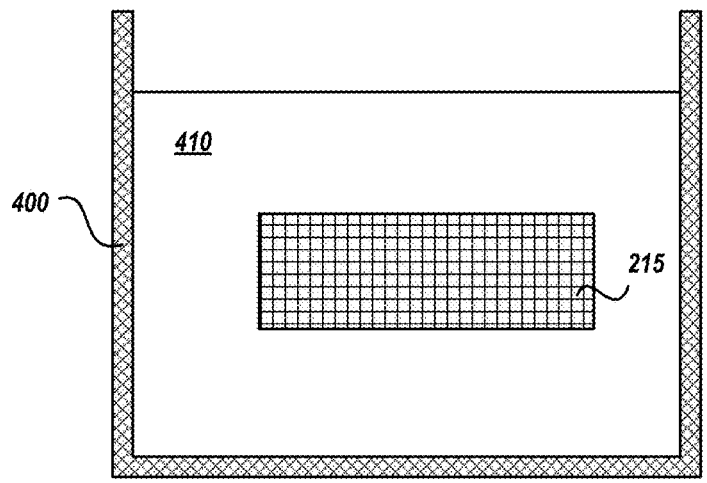
FIG. 15, FIG. 16A, and FIG. 16B depict respective tanks utilized to separate Po from a Sn alloy including Sn and a trace amount of Po, herein after referred to as a SnPo alloy, according to embodiments of the present invention.
Figure 16A:
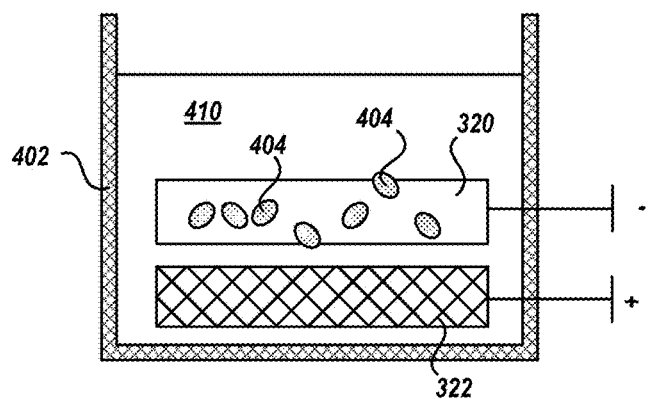
Figure 16B:
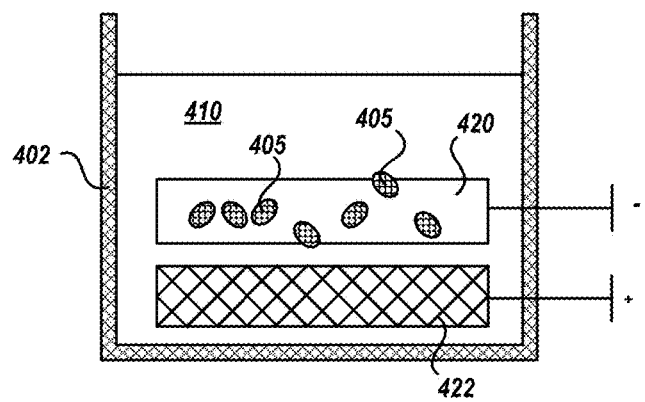

FIG. 15, FIG. 16A, and FIG. 16B depict respective tanks 400, 402, 402 utilized to separate Po from Sn and trace Po alloy 215, according to embodiments of the present invention. Tanks 400, 402 may be utilized by a plating bath vendor to fabricate purified Sn, purified Sn concentrate, etc. from the Sn and trace Po alloy 215. As shown in FIG. 15, a Sn concentrate 410 is formed from the Sn and trace Po alloy 215 in a first tank 400. For clarity, because Sn concentrate 410 was formed from Sn and trace Po alloy 215, Sn concentrate 410 includes both $Sn^{2+}$ ions and $Po^{2+}$ ions. In a particular embodiment, the Sn concentrate may be formed by dissolving Sn and trace Po alloy 215 using an acid. The Sn concentrate 410 is then moved into a second tank 402.

As shown in FIG. 16A, the second tank 402 may also include filtering cathode 320 and filtering anode 322 to reduce the concentration of $Po^{2+}$ ions within the Sn concentrate 410 by plating out Po 404 upon the filtering cathode 320. The purified Sn concentrate 410 having reduced $Po^{2+}$ ions may then be utilized in a Sn plating process to plate a test sample of Sn material. The test sample of plated Sn material may be tested to determine whether the Sn material meets a predetermined maximum alpha particle emitting threshold. For example, the sample plated Sn material may be tested to see whether it has an alpha particle emitting value of less than $2\alpha/cm^2/1000$ hours. If the sample plated Sn material does not meet the predetermined alpha emitting threshold, the plated Sn material is utilized to form another Sn concentrate 410 in a first tank that is subsequently purified by plating out Po upon the filtering cathode 320 in a second tank. This process may be iteratively performed until the plated Sn material meets the predetermined alpha particle emitting threshold.

As shown in FIG. 16B, the second tank may also include filtering cathode 420 and filtering anode 422 to filter the Sn concentrate 410 by plating out Sn upon the filtering cathode 420. The filtering cathode 420 has a surface area that is as least 10 times that of the filtering anode 422. In a particular embodiment, the filtering cathode 420 is formed from a material in which Sn that is plated thereto and may be separated there from. The filtering anode 422 may be either the Sn with trace Po alloy, a purified Sn metal, or an insoluble anode such as platinum, titanium or niobium. A downside of using an insoluble anode in this configuration is that the acid concentration will continue to increase and once the acid concentration goes above a value that destabilizes the bath (ca. 350 to 400 g/L methylsulfonic acid), the solution would need to be removed. The tank 402 in FIG. 16B may also include a membrane, such as Nafion, between the filtering anode 422 to filter the Sn concentrate 410 to reduce the increasing acid concentration issue when using an insoluble anode. The liquid in the side of the tank 403 nearest the anode which is called the anolyte will be filled with a low concentration of methylsulfonic acid. In this way, the acid can increase within the anolyte without impacting the quality of the concentrate that is being purified. Therefore, either the concentrate solution 410 can be extended to plate out as much purified Sn as possible, or a continuous feed stock of solution 410 can be added to create a continuous batch operation configuration.

he filtering cathode 420 and filtering anode 422 are electrically connected to a power supply (not shown) and may implement current controlled or potential controlled pulse plating to selectively plate purified Sn 405 upon the filtering cathode 420. For example, a current controlled pulse plating technique mimics an increase of agitation of the Sn concentrate 410 to increase the concentration of $Sn^{2+}$ ions near filtering cathode 420. In another example, a potential controlled pulse plating technique limits the plating potential to be below the plating potential of Po. If the potential controlled pulse plating technique is utilized a reference electrode is added to tank 402 to measure the potential at the plating surface of filtering cathode 420, similar to the reference electrode 230 depicted in FIG. 11. In a particular embodiment, a particular plating technique results in high plating bath agitation at the surface of filtering cathode 420 and includes a deposition pulse on-time of less than 10 msec with and a 0.5 DF.

Subsequent to plating purified Sn 405 upon the filtering cathode 420, the plated purified Sn 405 is separated from the filtering cathode 420. For example, the plated Sn is separated from the filtering cathode 420 by dissolving the purified Sn 405 electrolytically and collecting the purified Sn 405 using a membrane. The separated purified Sn 405 may then be utilized in a plating bath to plate a test sample of the purified Sn 405 be tested to determine whether the purified Sn 405 material meets a predetermined maximum alpha particle emitting threshold. For example, the sample plated purified Sn 405 may be tested to see whether it has an alpha particle emitting value of less than $2\alpha/cm^2/1000$ hours. If the sample plated purified Sn 405 does not meet the predetermined alpha particle emitting threshold, the plated purified Sn 405 is utilized to form another Sn concentrate 410 that is subsequently purified by selectively accumulating further purified Sn 405 upon the filtering cathode 420 while suppressing the plating of Po upon the filtering cathode 420. This process may be iteratively performed until the plated purified Sn 405 material meets the predetermined alpha particle emitting threshold.

Figure 17A:
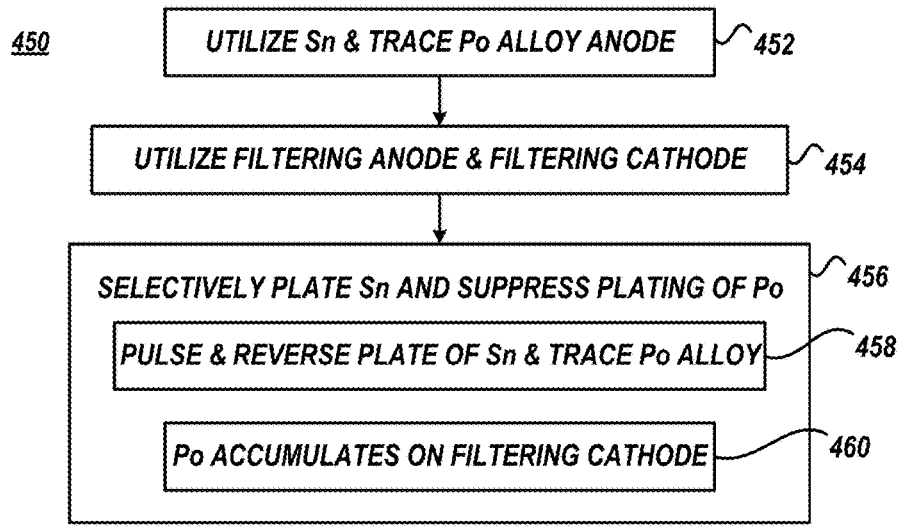
FIG. 17A, FIG. 17B, and FIG. 17C depict methods to separate Po from a SnPo alloy, according to embodiments of the present invention.

FIG. 17A depicts a method 450 to separate Po from Sn and trace Po alloy 215, according to embodiments of the present invention. Method 450 may be utilized, for example, when plating purified solder bumps 60 upon a semiconductor device. Method 450 begins by utilizing Sn and trace Po alloy 215 as a plating anode (block 452). Sn and trace Po alloy 215 is associated with a plating cathode, such as wafer 5. Both Sn and trace Po alloy 215 and the plating cathode are electrically connected to a first power supply. A plating technique, such as DC plating, pulse plating, etc. may be utilized to plate Sn and trace Po alloy 215 upon the plating cathode at a predetermined first deposition rate.

Method 450 may continue utilizing a filtering cathode 320 and filtering anode 322 simultaneously with the Sn and trace Po alloy 215 anode and plating cathode (block 454). The filtering cathode 320 and filtering anode 322 are electrically connected to a second power supply. Method 450 may continue by selectively plating Sn upon the plating cathode and suppressing the plating of Po upon the plating cathode (block 456). For example, a pulse and reverse plating technique is utilized (block 458) with the filtering cathode 320 and filtering anode 322 to accumulate Po upon the filtering cathode 320 (block 460). By accumulating Po upon the filtering cathode 320, $Po^{2+}$ ions are reduced within plating solution 213 thereby increasing the $Sn^{2+}$ ions near the plating cathode. In this way, a relatively greater concentration of $Sn^{2+}$ ions are located near wafer 5 thus increasing the concentration of Sn plated upon wafer 5 to form purified solder bumps 60. In a particular embodiment, the Po is plated upon the filtering cathode 320 at a second higher deposition rate relative to the predetermined first deposition rate. For example, with cathodic pulses, the Po is plated upon the filtering cathode 320 at approximately twice the deposition rate of Sn plating upon wafer 5 and with anodic pulses, is deplated from the filtering cathode 320 at approximately $1/8^{th}$ the rate of Sn plating upon wafer 5. Thus, over time, Po accumulates upon the filtering cathode 320 thereby reducing the $Po^{2+}$ ions within the plating solution 213 and allowing for the selective plating of Sn upon the plating cathode and the suppression of plating Po upon the plating cathode.

Figure 17B:
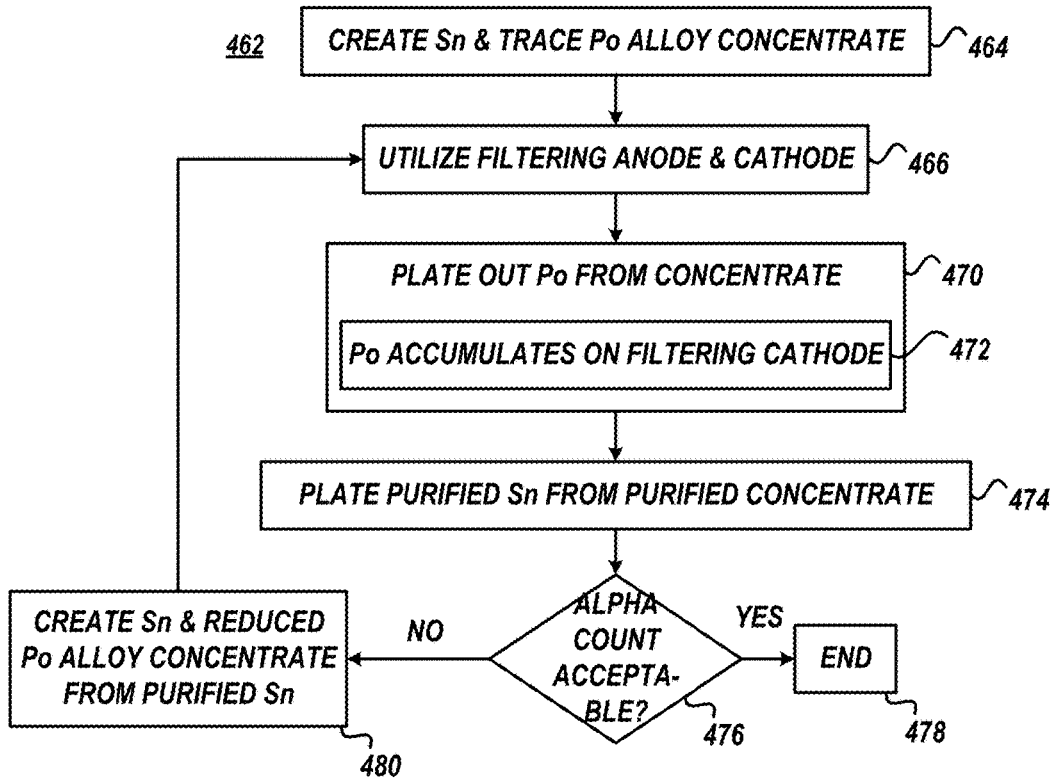

FIG. 17B depicts a method 462 to separate Po from Sn and trace Po alloy 215, according to embodiments of the present invention. Method 462 may be utilized by a plating bath vendor to provide purified plating products formed from Sn and trace Po alloy 215. Method 462 may begin by creating a Sn and trace Po concentrate 410 from Sn and trace Po alloy 215 (block 464). For example, Sn and trace Po alloy 215 may be dissolved in acid and oxidized utilizing a electrolytic membrane processes. The Sn and trace Po concentrate 410 may be formed in a first tank 400.

Method 462 may continue by utilizing a filtering cathode 320 and filtering anode 322 to plate out Po of the Sn and trace Po concentrate 410 upon the filtering cathode 320 (block 466). The Sn and trace Po concentrate 410 may be transferred to a second tank 402 that further includes the filtering cathode 320, filtering anode 322, and a power supply electrically connected to the filtering cathode 320 and filtering anode 322.

Method 462 may continue by utilizing a pulse and reverse plating technique (block 470) with the filtering cathode 320 and filtering anode 322 to accumulate Po upon the filtering cathode 320 (block 472). By accumulating Po upon the filtering cathode 320, $Po^{2+}$ ions are reduced within Sn and trace Po concentrate 410. This purified Sn and trace Po concentrate 410 is then utilized in a plating tool to plate a purified Sn sample (block 474). The test sample of plated Sn material may be tested to determine whether the Sn material meets a predetermined maximum alpha particle emitting threshold (block 476). For example, the sample plated Sn material may be tested to see whether it has an alpha particle emitting value of less than $2\alpha/cm^2/1000$ hours. If the sample plated Sn material does not meet the predetermined alpha particle emitting threshold, the plated Sn material is utilized to form another Sn concentrate 410 (block 480) and method 462 returns to block 466. If the sample plated Sn material does meet the predetermined alpha emitting threshold, the purified Sn and trace Po concentrate 410 is marked as low alpha emitting and method 462 ends at block 478. In some embodiments, the purified Sn and trace Po concentrate 410 may be sold to a customer as a low alpha particle emitting plating bath, as a low alpha particle emitting Sn formed from the purified Sn and trace Po concentrate 410, etc.

Figure 17C:
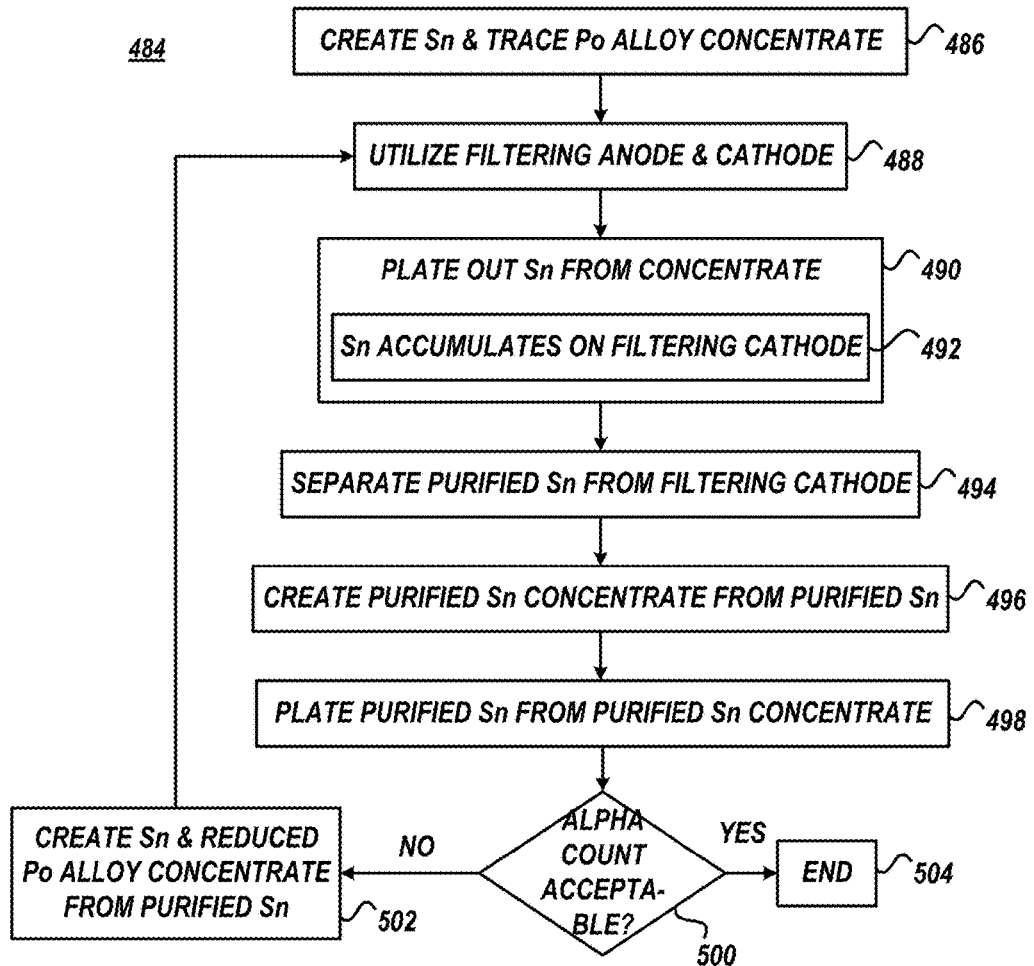

FIG. 17C depict a method 484 to separate Po from Sn and trace Po alloy 215, according to embodiments of the present invention. Method 484 may be utilized by a plating bath vendor to provide purified plating products formed from Sn and trace Po alloy 215. Method 484 may begin by creating a Sn and trace Po concentrate 410 from Sn and trace Po alloy 215 (block 486). For example, Sn and trace Po alloy 215 may be dissolved in acid and oxidized utilizing an electrolytic membrane processes. The Sn and trace Po concentrate 410 may be formed in a first tank 400.

Method 484 may continue by utilizing a filtering cathode 420 and filtering anode 422 (block 488) to plate out purified Sn 405 from the Sn and trace Po concentrate 410 upon the filtering cathode 420 (block 490). The Sn and trace Po concentrate 410 may be transferred to a second tank 402 that further includes the filtering cathode 420, filtering anode 422, and a power supply electrically connected to the filtering cathode 420 and filtering anode 422. The filtering cathode 420 and filtering anode 422 may be associated with a current controlled or potential controlled pulse plating technique to selectively plate purified Sn 405 upon the filtering cathode 420. For example, a current controlled pulse plating technique increases agitation of the Sn concentrate 410 to increase the concentration of $Sn^{2+}$ ions near filtering cathode 420. In another example, a potential controlled pulse plating technique limits the plating potential to be below the plating potential of Po. If the potential controlled pulse plating technique is utilized, a reference electrode is added to the plating system to measure the potential at the plating surface of filtering cathode 420. The potential of the reference electrode may be utilized in a feed back loop by the plating system to control the system's plating potential.

Subsequent to plating purified Sn 405 upon the filtering cathode 420, the plated purified Sn 405 is separated from the filtering cathode 420 (block 494). For example, the plated Sn is separated from the filtering cathode 420 by dissolving the purified Sn 405 electrolytically and collecting the purified Sn 405 using a membrane. The separated purified Sn 405 may then be utilized in a plating system to plate a test sample of the purified Sn 405 (block 498). The plated purified Sn 405 may be tested to determine whether the purified Sn 405 material meets a predetermined maximum alpha particle emitting threshold (block 500). For example, the sample plated purified Sn 405 may be tested to see whether it has an alpha particle emitting value of less than $2\alpha/cm^2/1000$ hours. If the sample plated purified Sn 405 does not meet the predetermined alpha emitting threshold, the plated purified Sn 405 is utilized to form another Sn concentrate 410 that is subsequently purified by selectively accumulating further purified Sn 405 upon the filtering cathode 420 while suppressing the plating of Po upon the filtering cathode 420 (block 502). If the sample plated purified Sn 405 does meet the predetermined alpha particle emitting threshold, the plated purified Sn 405 is marked as low alpha particle emitting and method 484 ends at block 504. In some embodiments, the purified Sn 405 or concentrated formed from the purified Sn 405 may be sold to a customer as a low alpha particle emitting plating product.

FIG. 18-FIG. 22 generally depict embodiments related to the heating Sn and trace Po alloy 215 to form and subsequently remove a stannic oxide and accumulated Po concentrated within the stannic oxide.

Figure 18:
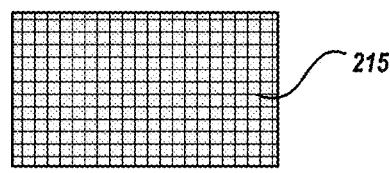
FIG. 18 depicts a SnPo alloy, according to embodiments of the present invention.

Referring to FIG. 18, Sn and trace Po alloy 215 is depicted as a raw alloy. In some embodiments, the Sn and trace Po alloy 215 may be a stand alone element. In other embodiments, the Sn and trace Po alloy 215 may take the form of plated solder upon a wafer 5, plated solder upon a semiconductor chip 10. In still other embodiments, the Sn and trace Po alloy 215 may take the form of solder placed upon laminate 100.

Figure 19A:
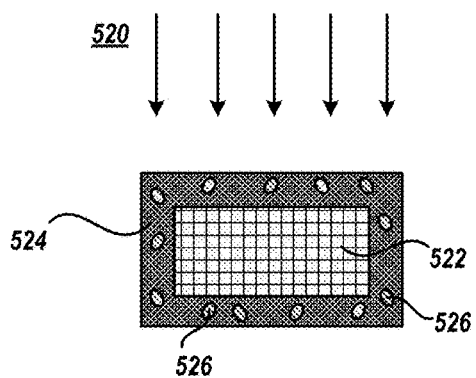
FIG. 19A depicts a SnPo alloy Sn oxidation and Po accumulation technique, according to embodiments of the present invention.

FIG. 19A depicts a Sn and trace Po alloy 215, Sn oxidation and Po heating operation 420, according to embodiments of the present invention. Heating operation 520 generally heats the Sn and trace Po alloy 215 in air to a temperature to form Sn oxide 524 but below the melting point of Sn and trace Po alloy 215. Heating operation 520 generally forms Sn oxide 524 upon exposed perimeter of Sn and trace Po alloy 215. The oxidation of Sn process results in Po 526 gettering to the Sn oxide 524. As a result of the Po 526 gettering to the Sn oxide 524, the inner portion of Sn and trace Po alloy 215 consists of a higher concentration of Sn relative to the concentration of Sn in Sn and trace Po alloy 215. This increased Sn portion of the inner Sn and trace Po alloy 215 is referred to as purified Sn 522.

Figure 19B:
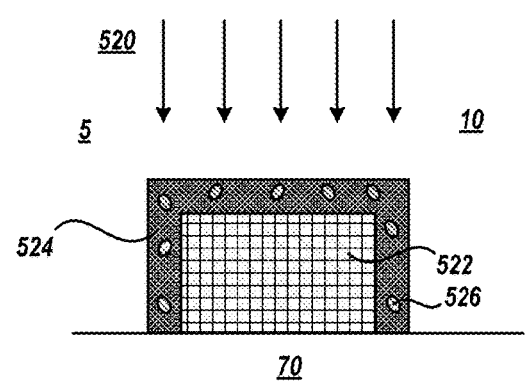
FIG. 19B depicts a SnPo alloy Sn oxidation and Po accumulation technique performed upon a semiconductor device, according to embodiments of the present invention.

FIG. 19B depicts the Sn and trace Po alloy 215 Sn oxidation and Po heating operation 520 performed upon a semiconductor device, such as wafer 5, semiconductor chip 10, etc. according to embodiments of the present invention. In the present embodiment, Sn and trace Po alloy 215 may take the form of plated solder bumps upon the semiconductor device. It may be previously determined that the semiconductor device has an alpha particle emission rate above a predetermined threshold. As opposed to scrapping the semiconductor device, it may undergo the Po heating operation 420 to accumulate the gettered Po 526 within the exposed oxidized Sn perimeter 524. The semiconductor device may undergo subsequent operations, described below, to remove the Sn oxide 524 and gettered Po, thus reducing alpha emitting particles that at least partially gave rise to the semiconductor device having the alpha particle emission rate above the predetermined threshold.

Figure 19C:
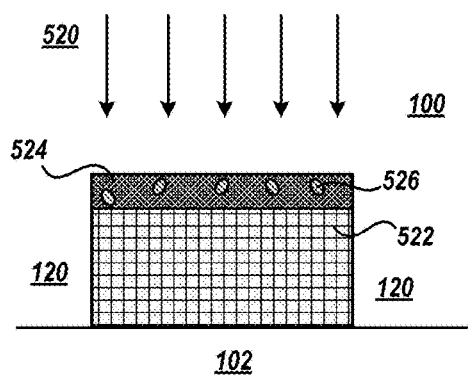
FIG. 19C depicts a SnPo alloy Sn oxidation and Po accumulation technique performed upon a semiconductor carrier, according to embodiments of the present invention.

FIG. 19C depicts the Sn and trace Po alloy 215 Sn oxidation and Po heating operation 420 performed upon a semiconductor carrier 100, according to embodiments of the present invention. In the present embodiment, Sn and trace Po alloy 215 may take the form of placed solder bumps upon the carrier 100. It may be previously determined that the semiconductor carrier 100 has an alpha particle emission rate above a predetermined threshold. As opposed to scrapping the semiconductor carrier 100, it may undergo the Po heating operation 520 to accumulate the gettered Po 526 within the exposed oxidized Sn perimeter 524. The semiconductor carrier 100 may undergo subsequent operations, described below, to remove the Sn oxide 524 and gettered Po, thus reducing alpha emitting particles that at least partially gave rise to the semiconductor carrier 100 having the alpha particle emission rate above the predetermined threshold.

Figure 20:
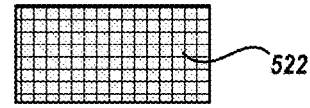
FIG. 20 depicts a purified Sn alloy including Sn and reduced Po, according to embodiments of the present invention.

FIG. 20 depicts purified Sn 522 that includes Sn and reduced Po, relative to Sn and trace Po alloy 215, according to embodiments of the present invention. Subsequent to forming Sn oxide 524 and gettering Po 526 within the Sn oxide 524, the accumulated Po 526 may be removed by stripping off the Sn oxide 524 leaving the purified Sn 522. The purified Sn 522 may be tested for alpha particle emissions to determine if its alpha particle emission rate meets a predetermined threshold. If so, the purified Sn 522 may be utilized in plating operations. For example, the purified Sn 522 may be used as the purified plating material 216, as shown in FIG. 6 to plate purified solder bumps 60 upon wafer 5.

In embodiments where the oxidized Sn 524 and trace Po alloy 215 is utilized as a solder and is located upon a semiconductor device or a semiconductor carrier 100, the Sn oxide 524 may be removed by applying a solder flux to the solder, performing a solder reflow to dissolve the Sn oxide 524 and Po 526 in the flux, and performing a flux clean to remove the flux, the Sn oxide 524, and the Po 526. The semiconductor device or semiconductor carrier 100 may be again tested to determine whether its alpha particle emission rate meets the threshold. If not, the semiconductor device or semiconductor carrier 100 may again be put through heating operation 520 where additional Po 526 is accumulated in Sn oxide 524 and subsequently removed.

Figure 21:
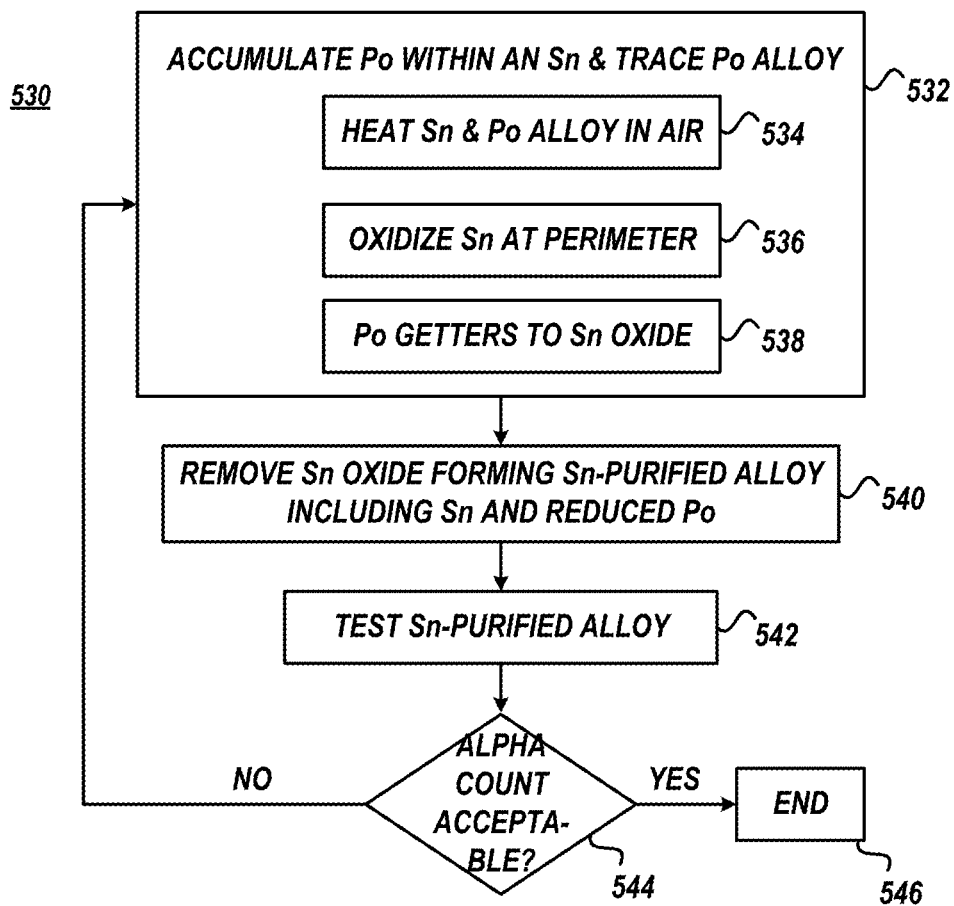
FIG. 21 depicts a method of forming a purified Sn alloy including Sn and reduced Po, according to embodiments of the present invention.

FIG. 21 depicts a method 530 of forming purified Sn 522 including Sn and reduced Po 526, relative to an initial concentration of Po, according to embodiments of the present invention. Method 530 may be utilized to create raw material, such as purified plating material 216 Sn that is a low alpha particle emission material from Sn and trace Po alloy 215 that is not a low alpha particle emission material. Method 530 begins by accumulating Po 526 within the Sn and trace Po alloy 215 (block 532). For example, Sn and trace Po alloy 215 may be heated in air to a temperature to form Sn oxide 524 upon the perimeter but less than the melting point of the Sn and trace Po alloy 215 (block 532). The heating of Sn and trace Po alloy 215 oxidizes Sn at exposed perimeter surfaces of the Sn and trace Po alloy 215 (block 536). The Sn oxidization processes getters Po 526 to the Sn oxide 524 (block 538). In other words, the Po 526 becomes concentrated within the Sn oxide 524.

Method 530 may continue by removing the Sn oxide 524 forming purified Sn 522 including Sn and reduced Po 526 (block 540). The Sn oxide 524 may be removed by known techniques. Along with the Sn oxide 524, the accumulated Po 526 is also removed. Thus the relative concentration of Sn in the remaining material is increased and forms purified Sn 522. For clarity, purified Sn 522 may still include a trace amount of Po 526 but the relative concentration of Po is reduced compared to the initial concentration of Po 525 in Sn and trace Po alloy 215. Method 530 may continue by testing the purified Sn 522 for alpha particle emissions to determine if its alpha particle emission rate meets a predetermined threshold. If so, method 530 ends at block 536 and the purified Sn 522 may be subsequently utilized in plating operations e.g., as purified plating material 216 in order to plate purified solder bumps 60. If the purified Sn 522 does not meet the alpha particle emission threshold the method 530 returns to block 532 where the purified Sn 522 is operated upon to accumulate and remove Po 526.

Figure 22:
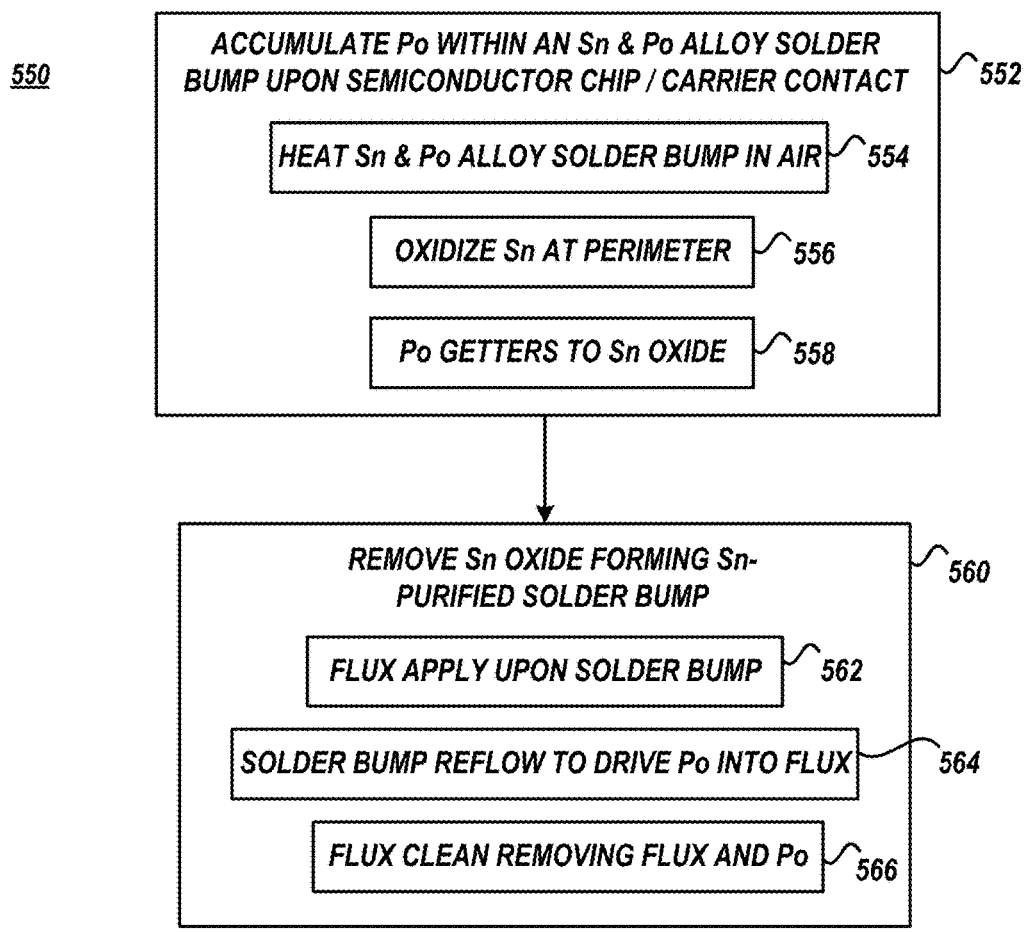
FIG. 22 depicts a method of forming a purified Sn alloy solder bump, including Sn and reduced Po, upon a semiconductor device or semiconductor carrier, according to embodiments of the present invention.

FIG. 22 depicts a method 550 of forming a purified Sn 522 solder bump, including Sn and reduced Po 526 solder bump, upon a semiconductor device, such as wafer 5, semiconductor chip 10, or semiconductor carrier 100, according to embodiments of the present invention. Method 550 may be utilized to rework a fabricated wafer 5, semiconductor chip 10, or semiconductor carrier 100 that does not meet an alpha particle emission threshold to reduce the alpha particle emissions thereof. Method 550 begins by accumulating Po 526 within Sn and trace Po alloy 215 solder bump (block 552). Generally the solder bump may be plated upon, placed upon, etc. the fabricated wafer 5, semiconductor chip 10, or semiconductor carrier 100. The Po 526 may be accumulated by heating the fabricated wafer 5, semiconductor chip 10, or semiconductor carrier 100 in air to a temperature to form Sn oxide 524 upon the perimeter of the solder bump but less than the melting point of the solder bump (block 554). The heating of the solder bump oxidizes Sn 524 at exposed perimeter surfaces of the Sn and trace Po alloy 215 solder bump (block 556). The Sn oxidization processes getters Po 526 to the Sn oxide 524 (block 538). In other words, the Po 526 becomes concentrated within the Sn oxide 524.

Method 550 may continue by removing the Sn oxide 524 forming purified Sn 522 including Sn and reduced Po 526 (block 560). The Sn oxide 524 may be removed by applying flux the solder bump (block 562), performing a solder reflow to activate the flux and dissolve the Sn oxide 524 and Po 526 in the flux (block 564), and performing a flux clean to remove the flux, the Sn oxide 524, and the Po 526 (block 566). Thus the relative concentration of Sn in the remaining solder bump is increased. For clarity, the remaining solder bump may still include a trace amount of Po 526 but the relative concentration of Po is reduced compared to the initial concentration of Po 525 in the Sn and trace Po alloy 215 solder bump. Method 550 may continue by testing the fabricated wafer 5, semiconductor chip 10, or semiconductor carrier 100 for alpha particle emissions to determine if its alpha particle emission rate meets the predetermined threshold. If so, method 550 ends. If the fabricated wafer 5, semiconductor chip 10, or semiconductor carrier 100 does not meet the alpha particle emission threshold method 550 returns to block 552 where the fabricated wafer 5, semiconductor chip 10, or semiconductor carrier 100 is operated upon to further purify the solder bump.

FIG. 23-FIG. 27 generally depict embodiments of filtering Po from a plating bath utilizing a Po filter element.

Figure 23:
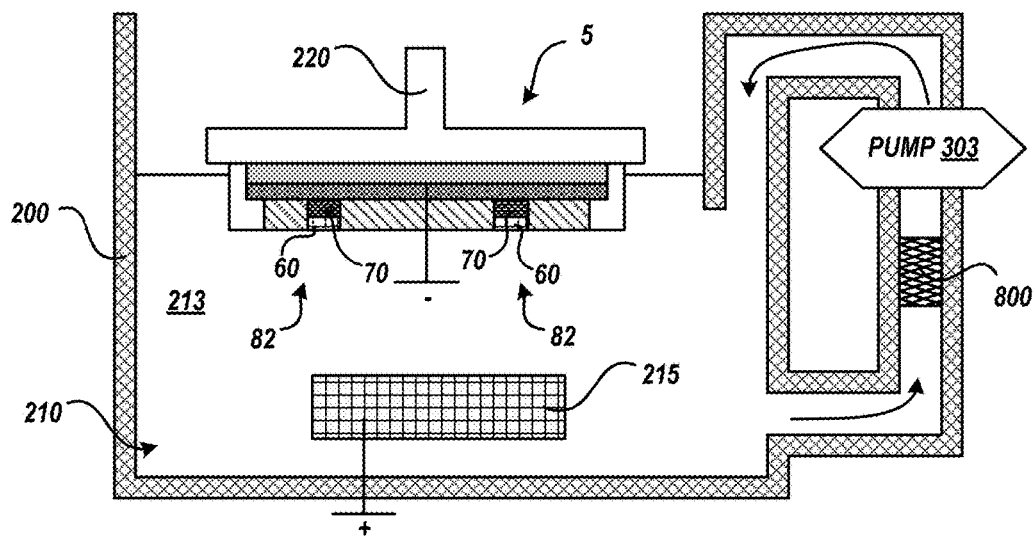
FIG. 23 depicts a plating tool and semiconductor device at a particular stage of fabrication, in accordance with various embodiments of the present invention.

FIG. 23 depicts a plating tool 200 and semiconductor wafer 5 at a particular stage of fabrication in which purified solder 60 is formed upon plate 70. Subsequent to the formation of plate 70 the wafer 5 is placed in a reservoir 210 which contains a solder 60 plating solution 213, such as SnAg plating bath. The wafer 5 may again be attached to fixture 220 that accepts wafer 5, wraps around wafer 5, and contacts electrically conductive perimeter region 42 such that only the plate 70 within trenches 82 are exposed to the plating solution 213. An electrical circuit is created when a negative terminal of a power supply contacts electrically conductive perimeter region 42 of wafer 5 so as to form a cathode and a positive terminal of the power supply is connected to a Sn and trace Po alloy 215 in the tool 200 so as to form an anode.

The Sn and trace Po alloy 215 may be a stabilized metal specie in the plating solution 213. During the plating process, when an electrical current is passed through the circuit, the Sn and trace Po alloy 215 is dissolved resulting in $Sn^{2+}$ ions and $Po^{2+}$ ions in the solution 213. The $Po^{2+}$ ions in the solution 213 are filtered from the solution 213 by Po filtering element 800. In the embodiment depicted in FIG. 23, the Po filtering element 800 is placed in a plating tool 200 filter housing in which a pump 303 circulates the plating solution 213 within reservoir 210 across the Po filtering element 800. In yet another embodiment, depicted in FIG. 27, the Po filtering element 800 is placed in an accessible location, for example in base of the reservoir 210, to allow for the replacement of the Po filtering element 800. Generally, the Po filtering element 800 reduces $Po^{2+}$ ions in the solution 213 by the $Po^{2+}$ ions take-up electrons from the Po filtering element 800 thereby absorbing Po within the Po filtering element 800. By reducing the $Po^{2+}$ ions in the solution 213 a greater concentration of $Sn^{2+}$ ions are maintained in the solution 213 to plate upon wafer 5.

Figure 24:
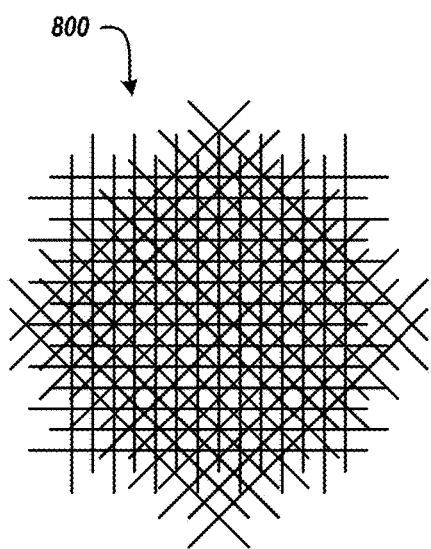
FIG. 24 depicts a filter element utilized in a plating tool, in accordance with various embodiments of the present invention.

FIG. 24 depicts a Po filter element 800, in accordance with various embodiments of the present invention. Po filter element 800 has high surface area and can be made from Titanium, such as a mesh, comprising an outer stannic oxide perimeter. The Po filter element 800 may be formed by immersing the high surface area Titanium into a solution of Sn(II) MSA. The Sn(II) reduces onto the high surface area Titanium as pure Sn and corrodes Ti(II) into the Sn(II) MSA solution. Upon removal from the Sn(II) MSA solution, the high surface area Titanium includes a pure Sn perimeter. The high surface area Titanium which includes the pure Sn perimeter may be subsequently heated to oxidize the Sn perimeter converting the pure Sn to stannic oxide forming Po filter element 800. For example, in a particular embodiment, the high surface area Titanium which includes the pure Sn perimeter may be heated in air at 150 degrees Celsius for 2 hours to convert the pure Sn to stannic oxide. Po filter element 800 may then be placed within the plating tool to allow the stannic oxide perimeter to getter $Po^{2+}$ ions in the solution 213 by the $Po^{2+}$ ions adsorbing and entering within the stannic oxide perimeter causing Po to be sequestered within the Po filter element 800. Over time Po filter element 800 may loose available absorption sites to sequester Po within the Po filter element 800. As such, the Po filter element 800 may be occasionally replaced with a new Po filter element 800. In one embodiment, the Po filter element 800 can be removed, rinsed, dried and the alpha particle emission measured to see if the filter is saturated with Po.

Figure 25:
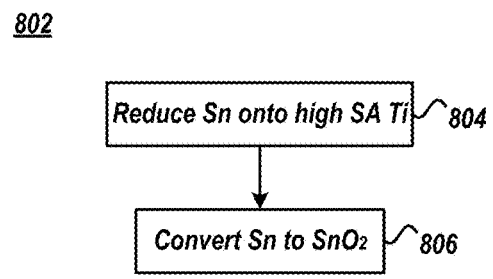
FIG. 25 depicts a method of forming a filter element, in accordance with various embodiments of the present invention.

FIG. 25 depicts a method 802 of forming a Po filter element 800, in accordance with various embodiments of the present invention. Method 802 begins with reducing pure Sn upon a high surface area Titanium, such as a Titanium mesh (block 804). For example, the high surface area Titanium may be immersed in a solution of Sn(II) MSA. The Sn(II) reduces onto the high surface area Titanium as pure Sn and corrodes Ti(II) into the Sn(II) MSA solution. Upon removal from the Sn(II) MSA solution, the high surface area Titanium comprises pure Sn perimeter.

Method 802 continues by converting the pure Sn to a stannic oxide perimeter (block 806). For example, the high surface area Titanium which includes the pure Sn perimeter may be heated to oxidize the pure Sn perimeter converting the pure Sn to stannic oxide. In a particular implementation, the Titanium mesh which includes the pure Sn perimeter may he heated in air at 150 degrees Celsius for 2 hours to convert the pure Sn perimeter to a stannic oxide perimeter.

Figure 26:
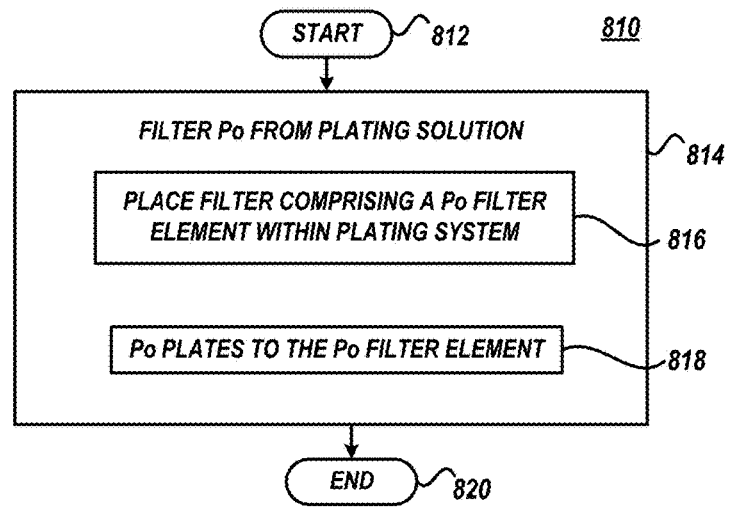
FIG. 26 depicts a method of filtering Po from a plating bath, in accordance with various embodiments of the present invention.
Figure 27:
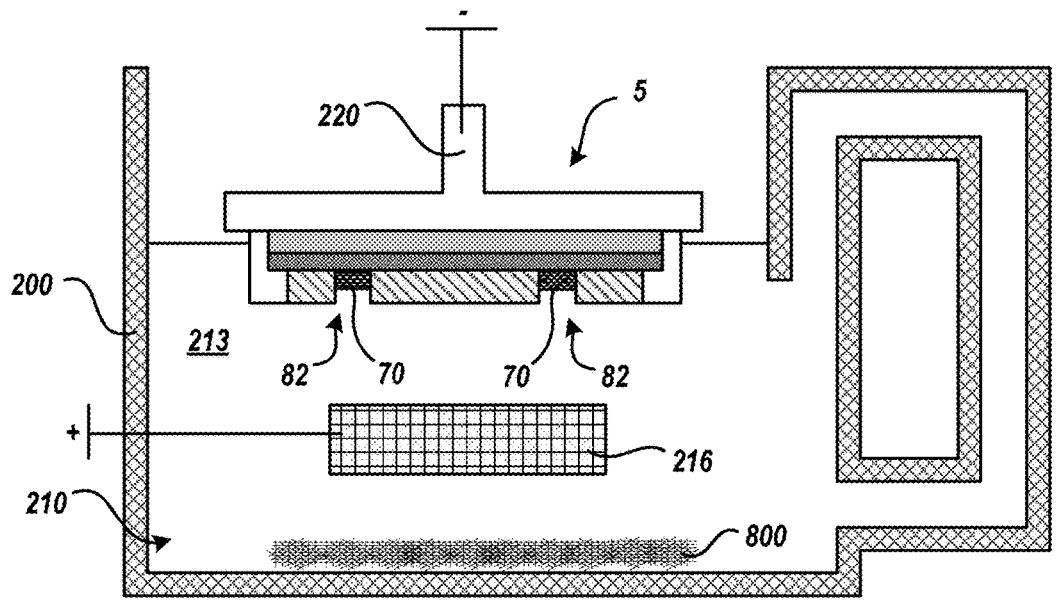
FIG. 27 depicts a plating tool and semiconductor device at a particular stage of fabrication, in accordance with various embodiments of the present invention.

FIG. 26 depicts a method 810 of filtering Po from a plating bath 213, in accordance with various embodiments of the present invention. Method 810 may be utilized, for example, by a semiconductor device fabricator. Method 810 begins at block 812 and continues with filtering Po, Po ions, etc. from plating bath 213 (block 814). During plating, when an electrical current is passed through the plating anode and plating cathode, the Sn and trace Po alloy 215 anode is dissolved resulting in $Sn^{2+}$ ions and $Po^{2+}$ ions in the solution 213. The $Po^{2+}$ ions in the solution 213 are filtered from the solution 213 by Po filtering element 800. In an embodiment, the Po filtering element 800 is placed in a plating tool 200 filter housing in which a pump 303 circulates the plating solution 213 within reservoir 210 across the Po filtering element 800 (block 816). In yet another embodiment, the Po filtering element 800 is placed in an accessible location, for example in base of the reservoir 210, to allow for the replacement of the Po filtering element 800 (block 816). Method 810 may continue by the Po filtering element 800 reducing $Po^{2+}$ ions in the solution 213 by the $Po^{2+}$ ions taking-up electrons from the Po filtering element 800 thereby plating Po upon the Po filtering element 800. (block 818). By reducing the $Po^{2+}$ ions in the solution 213 a greater concentration of $Sn^{2+}$ ions are maintained in the solution 213 to plate upon the semiconductor device. Method 810 ends at block 820.

The accompanying figures and this description depicted and described embodiments of the present invention, and features and components thereof. Those skilled in the art will appreciate that any particular nomenclature used in this description was merely for convenience, and thus the invention should not be limited by the specific process identified and/or implied by such nomenclature. Therefore, it is desired that the embodiments described herein be considered in all respects as illustrative, not restrictive, and that reference be made to the appended claims for determining the scope of the invention.

The exemplary methods and techniques described herein may be used in the fabrication of integrated circuit chips. The resulting integrated circuit chips can be distributed by the fabricator in raw wafer form (i.e., as a single wafer that has multiple unpackaged chips), as a bare die, or in a packaged form. In the latter case, the chip is mounted in a single chip package (e.g., a plastic carrier, with leads that are affixed to a motherboard or other higher level carrier) or in a multichip package (e.g., a ceramic carrier that has either or both surface interconnections or buried interconnections). The chip is then integrated with other chips, discrete circuit elements and/or other signal processing devices as part of either (a) an intermediate product, such as a motherboard, or (b) an end product. The end product can be any product that includes integrated circuit chips, ranging from toys and other low-end applications to advanced computer products having numerous components, such as a display, a keyboard or other input device and/or a central processor, as non-limiting examples.

What is claimed is:

1. A plating product fabrication method comprising:
   forming a first concentrate, the concentrate comprising a metal species and a trace amount of an alpha emitting species;
   creating a circuit between a filtering anode and a filtering cathode; and
   reducing the alpha emitting species from the concentrate by plating the alpha emitting species upon the filtering cathode.

2. The method of claim 1, wherein a pulse and reverse pulse current is passed through the circuit to plate the alpha emitting species upon the filtering cathode.

3. The method of claim 2, wherein reducing the alpha emitting species from the concentrate by plating the alpha emitting species upon the filtering cathode comprises forming a first purified concentrate comprising the metal species and a reduced amount of the alpha emitting species relative to the first concentrate.

4. The method of claim 3, further comprising:
   subsequently plating the metal species of the first purified concentrate upon a plating cathode.

5. The method of claim 4, further comprising:
   testing an alpha particle emission rate of the alpha emitting species plated upon the plating cathode from the first purified concentrate (plated alpha emitting species).

6. The method of claim 5, further comprising:
   if the alpha particle emission rate exceeds a predetermined maximum threshold, forming a second concentrate comprising the plated alpha emitting species.

7. The method of claim 1, wherein plating the alpha emitting species upon the filtering cathode comprises forming a purified alpha emitting species.

8. The method of claim 7, further comprising:
   forming a plating bath comprising the purified alpha emitting species.

* * * * *